(12) United States Patent
Lee et al.

(10) Patent No.: US 9,929,475 B2
(45) Date of Patent: Mar. 27, 2018

(54) WAVEBAND ELECTROMAGNETIC WAVE ABSORBER AND METHOD FOR MANUFACTURING SAME

(75) Inventors: Sang-Kwan Lee, Changwon-si (KR); Sang-Bok Lee, Gimhae-si (KR); Ki Hyeon Kim, Daegu-si (KR); Yong-Ho Choa, Seongnam-si (KR); Sung-Tag Oh, Gunpo-si (KR)

(73) Assignee: KOREA INSTITUTE OF MACHINERY & MATERIALS, Daejeon-si (KR)

(*) Notice: Subject to any disclaimer, the term of this patent is extended or adjusted under 35 U.S.C. 154(b) by 899 days.

(21) Appl. No.: 13/697,043

(22) PCT Filed: May 9, 2011

(86) PCT No.: PCT/KR2011/003434
§ 371 (c)(1),
(2), (4) Date: Dec. 12, 2012

(87) PCT Pub. No.: WO2011/142565
PCT Pub. Date: Nov. 17, 2011

(65) Prior Publication Data
US 2013/0140076 A1 Jun. 6, 2013

(30) Foreign Application Priority Data

May 10, 2010 (KR) .................. 10-2010-0043531
Nov. 25, 2010 (KR) .................. 10-2010-0118067

(51) Int. Cl.
*H01Q 17/00* (2006.01)
*H05K 9/00* (2006.01)

(52) U.S. Cl.
CPC ......... *H01Q 17/004* (2013.01); *H01Q 17/002* (2013.01); *H05K 9/0083* (2013.01); *H05K 9/0086* (2013.01); *Y10T 29/49117* (2015.01)

(58) Field of Classification Search
CPC ......... H01Q 17/00–17/008; F41H 3/00; C09D 5/32; H05K 9/0081–9/0092
See application file for complete search history.

(56) References Cited

U.S. PATENT DOCUMENTS 4,003,840 A * 1/1977 Ishino ............... B65D 81/3446
219/744
4,371,742 A * 2/1983 Manly ................. H01B 11/146
174/36

(Continued)

FOREIGN PATENT DOCUMENTS

CN      1926933 A     3/2007
JP      10-126089     5/1998

(Continued)

OTHER PUBLICATIONS

Yang et al. "Preparation and properties of a novel iron-coated carbon fiber". Journal of Magnetism and Magnetic Materials. vol. 256. Jan. 2003. pp. 129-132.*

*Primary Examiner* — Matthew M Barker
(74) *Attorney, Agent, or Firm* — Miller, Matthias & Hull LLP

(57) ABSTRACT

Provided is a wideband electromagnetic wave (EMW) absorber including a magnetic composite having a structure in which magnetic particles are dispersed in a polymer resin, and a plurality of conductive lines arranged in the magnetic composite, and a method of manufacturing the same. The wideband EMW absorber can be used for a device configured to emit EMWs and effectively absorb wideband EMWs.

12 Claims, 36 Drawing Sheets

(56) References Cited

U.S. PATENT DOCUMENTS

| | | | | | |
|---|---|---|---|---|---|
| 4,814,546 | A | * | 3/1989 | Whitney | H05K 9/0083 156/51 |
| 5,085,931 | A | * | 2/1992 | Boyer, III | H01Q 17/005 252/513 |
| 5,786,785 | A | * | 7/1998 | Gindrup | C03C 17/10 342/1 |
| 6,406,783 | B1 | * | 6/2002 | Phillips | H01Q 17/00 428/313.5 |
| 6,683,246 | B2 | * | 1/2004 | Hashimoto | H05K 9/0088 174/394 |
| 6,887,412 | B1 | * | 5/2005 | Ono | H01F 1/0027 252/62.54 |
| 6,972,097 | B2 | * | 12/2005 | Yoshida | H01F 1/22 252/62.54 |
| 6,995,632 | B2 | * | 2/2006 | Saito | H01P 1/215 333/175 |
| 7,030,172 | B2 | * | 4/2006 | Sakurai | C04B 26/32 523/136 |
| 7,234,234 | B2 | * | 6/2007 | Saito | H01P 11/007 264/272.11 |
| 7,625,633 | B2 | * | 12/2009 | Kawaguchi | H01F 10/08 428/411.1 |
| 7,869,216 | B2 | * | 1/2011 | Stevenson | H05K 9/0083 361/708 |
| 8,222,321 | B2 | * | 7/2012 | Youm | B82Y 30/00 523/205 |
| 8,378,877 | B2 | * | 2/2013 | Tishin | C04B 38/02 342/1 |
| 8,564,472 | B2 | * | 10/2013 | Okamura | H01Q 1/526 342/1 |
| 2004/0039099 | A1 | * | 2/2004 | Motojima | C08F 2/44 524/496 |
| 2004/0225213 | A1 | * | 11/2004 | Wang | A61K 49/1818 600/421 |
| 2006/0278843 | A1 | * | 12/2006 | Someda | C08J 3/212 252/62.54 |
| 2009/0114440 | A1 | * | 5/2009 | Yamamoto | H01F 1/26 174/391 |
| 2009/0314411 | A1 | * | 12/2009 | Kawaguchi | H01F 10/08 156/60 |
| 2010/0200794 | A1 | * | 8/2010 | Cornelius | C08J 9/224 252/62 |
| 2010/0323138 | A1 | * | 12/2010 | Yoshioka | D02G 3/06 428/36.1 |

FOREIGN PATENT DOCUMENTS

| | | | |
|---|---|---|---|
| JP | 2001-20150 | | 1/2001 |
| JP | 2001026412 | A | 1/2001 |
| JP | 2001068312 | A | 3/2001 |
| JP | 2003092475 | A | 3/2003 |
| JP | 2003133659 | A | 5/2003 |
| JP | 2004004261 | A | 1/2004 |
| JP | 2004140335 | A | 5/2004 |
| JP | 2004335769 | A | 11/2004 |
| JP | 2006054377 | A | 2/2006 |
| JP | 2009176901 | A | 8/2009 |
| JP | 2009185378 | A | 8/2009 |
| JP | 2009206454 | A * | 9/2009 |
| JP | 2010010635 | A | 1/2010 |
| JP | 2010045120 | A | 2/2010 |
| KR | 10-2001-0093434 | | 10/2001 |
| KR | 20070035832 | A | 4/2007 |
| WO | 2006059711 | A1 | 6/2006 |
| WO | WO 2009015661 | A2 * | 2/2009 ............ C08J 9/224 |
| WO | WO 2009133947 | A1 * | 11/2009 ............ D02G 3/06 |

* cited by examiner

WAVEBAND ELECTROMAGNETIC WAVE ABSORBER AND METHOD FOR MANUFACTURING SAME

CROSS REFERENCE TO RELATED APPLICATIONS

This application is a 35 USC § 371 US National Stage patent application of International Patent Application No. PCT/KR2011/003434 filed on May 9, 2011, which claims priority under the Paris Convention to Korean Patent Application No. 10-2010-0043531, filed May 10, 2010 and Korean Patent Application No. 10-2010-0118067 filed Nov. 25, 2010.

TECHNICAL FIELD

This disclosure relates to an electromagnetic wave (EMW) absorber and a method of manufacturing the same, and more particularly, to a wideband EMW absorber, which is used for a device configured to emit EMWs and capable of absorbing wideband EMWs, and a method of manufacturing the same.

BACKGROUND ART

Recently, with the development of electrical and electronic devices and advanced information communication devices, the operating frequency of circuits tends to increase to a high-frequency band of several GHz, and devices tend to be multi-functional and downscaled. These devices have become seriously problematic in terms of malfunctions and signal quality degradation, which are caused by electromagnetic interference (EMI) and occurrence of noise, and human-harmful electromagnetic waves (EMWs) and the pollution of EMWs due to emission of EMWs. To solve signal quality degradation affected by secondary interference due to reflection caused by a conventional EMW shield or EMI caused by coupling between adjacent signal lines, development of a technique of absorbing EMWs using a magnetic material has become brisk.

An EMW absorbing material serves an important function to inhibit noise causing malfunctions in devices in electronic devices (e.g., circuit patterns, mounting components, cables, and the like), which have lately become more lightweight, thinner, and simpler, prevent crosstalk between circuit blocks or dielectric coupling in an adjacent substrate, and improve receiving sensitivity of an antenna, or reduce the influence of EMWs on the human body. In particular, to equally apply EMW absorbing material to electronic components used in various frequency bands, widening the frequency band of EMW absorbing is essential.

In near-field EMW absorbing technology, it is imperatively necessary to develop a chip-level ultrathin absorbing material capable of reducing not only EMI caused by multi-functional high-density mounting of components of electronic devices and single chips and an increase in frequency, but also interference between digital-analog signals, and removing EMW noise and controlling EMI to improve signal quality in a wide band of ~GHz. Presently, in the case of the chip-level ultrathin absorbing material, there is an urgent need to take measures for EMI in a high frequency band worldwide to prevent malfunctions in electronic components and chips and signal quality degradation due to conduction noise, coupling, and electromagnetic radiation (EMR) of fine, complicated signal lines on a unit space and digital-analog interference. Furthermore, since near-field and far-field EMW absorbing technology is the kernel of advanced electromagnetic compatibility (EMC) and radio-frequency identification (RFID) and military hiding techniques, it is necessary to develop a wideband absorbing material in which new dielectric and magnetic materials are complicated.

A magnetic material having a high permeability is mainly employed to obtain a high absorbing power. However, since resonance occurs in most magnetic materials with an increase in frequency, the magnetic materials nearly lose their magnetic permeabilities in a frequency range of several GHz. Also, since a magnetic spin has directionality, fine control for absorption of EM energy is very difficult according to complicated directionality of a device or circuit. To overcome this drawback, ultrathin magnetic metal particles having a high aspect ratio are needed in terms of material shape, and techniques of orienting and dispersing metal particles in an absorbing material are also necessarily required. Meanwhile, with an increase in integration density of electronic components, effectively controlling heat generated on a chip in an EMW absorber during a process of absorbing incident EM energy and converting the EM energy into heat has become an important issue. Accordingly, it is important to design an ultrathin EMW absorbing material according to an aspect ratio of magnetic particles in a magnetic composite. In this case, the degree of technical difficulty may be regarded as very high.

SUMMARY OF THE DISCLOSURE

This disclosure is directed to a wideband electromagnetic wave (EMW) absorber that may be used for a device configured to emit EMWs and capable of absorbing wideband EMWs.

Furthermore, this disclosure is directed to a method of manufacturing a wideband EMW absorber, which may easily manufacture a wideband EMW absorber that is used for a device configured to emit EMWs and capable of absorbing wideband EMWs.

A wideband electromagnetic wave (EMW) absorber is disclosed that includes a magnetic composite in which magnetic particles are dispersed in a polymer resin, and a plurality of conductive lines arranged in the magnetic composite.

The conductive lines may include conductive lines periodically arranged at predetermined intervals. The conductive lines may include a plurality of conductive lines arranged parallel to a signal line of a device configured to emit EMWs. The plurality of conductive lines arranged parallel to the signal line may have the same linewidth as the signal line.

The conductive lines may include a plurality of conductive lines arranged in a first direction, and a plurality of conductive lines arranged in a second direction. The conductive lines arranged in the first direction and the conductive lines arranged in the second direction may form a lattice-type grid. The conductive lines arranged in the first direction may include a plurality of conductive lines periodically arranged at predetermined intervals, and the conductive lines arranged in the second direction may include a plurality of conductive lines periodically arranged at predetermined intervals. An interval between the conductive lines arranged in the first direction may be equal to an interval between the conductive lines arranged in the second direction. The conductive lines arranged in the first direction may be arranged parallel to a signal line of a device configured to emit EMWs, and the conductive lines arranged in the second direction may be arranged vertical to the signal line of the device configured to emit the EMWs.

The plurality of conductive lines arranged parallel to the signal line may have the same linewidth as the signal line.

The conductive lines may be arranged in a central portion between upper and lower portions of the magnetic composite.

The conductive lines may be formed of a magnetic conductor, which is an iron (Fe)-based metal, a cobalt (Co)-based metal, a nickel (Ni)-based metal, a molybdenum (Mo)-based metal, a manganese (Mn)-based metal, a neodymium (Nd)-based metal, or an alloy thereof.

The conductive lines may be formed of a non-magnetic conductor, which is a gold (Au)-based metal, a silver (Ag)-based metal, a copper (Cu)-based metal, an aluminum (Al)-based metal, a platinum (Pt)-based metal, a palladium (Pd)-based metal, or an alloy thereof.

The conductive lines may be formed of at least one kind of carbon-based conductor selected out of carbon nanotubes (CNTs), carbon nanofibers (CNFs), carbon black, carbon fibers, and graphene.

The conductive lines may be formed of an oxide-based conductor or a conductive polymer.

The magnetic particles may be magnetized particles of a Fe-based metal, a Co-based metal, a Ni-based metal, a Mo-based metal, a Mn-based metal, a Nd-based metal, or an alloy thereof.

The magnetic particles may be magnetized particles coated with at least one kind of dielectric material selected out of titanium oxide, barium-titanium oxide, and strontium-titanium oxide.

The magnetic particles may be particles of at least one kind of carbon-based conductor selected out of CNTs, CNFs, carbon black, carbon fiber, and graphene, which are coated with a magnetic body.

The magnetic particles may be spherical particles, plate-type particles, flake-type particles, rod-type particles, or wire-type particles having an aspect ratio of about 1 to about 1000.

The magnetic particles may include hollow spherical particles, hollow tube-type particles, hollow wire-type particles, or hollow flake-type particles.

The magnetic particles may include at least two kinds of particles selected out of spherical particles, plate-type particles, flake-type particles, rod-type particles, wire-type particles, hollow spherical particles, hollow tube-type particles, hollow wire-type particles, and hollow flake-type particles.

The magnetic particles may include a plurality of magnetic particles having different resonant frequencies.

At least one kind of carbon-based conductor selected out of CNTs, CNFs, carbon black, carbon fibers, and graphene may be dispersed in the polymer resin and contained at a content of about 0.01% to about 70%, based on the total weight of the magnetic composite.

The polymer resin may include a thermoplastic or thermosetting resin.

The resonant frequency of the magnetic composite may be determined by controlling the size and shape of the magnetic particles, and EMWs may be absorbed in a frequency band equal to or higher than the resonant frequency of the magnetic composite.

The magnetic particles may contain ferrite-based oxide.

The ferrite oxide may contain a spinel ferrite or a hexagonal ferrite.

The spinel ferrite may include a spinel-structured ferrite containing a nickel-zinc (Ni—Zn) ferrite, a manganese-zinc (Mn—Zn) ferrite, or a copper-zinc (Cu—Zn) ferrite, and the hexagonal ferrite may include a hexagonal-structured ferrite containing a barium (Ba) ferrite or a strontium (Sr) ferrite.

Another aspect of this disclosure provides a method of manufacturing a wideband EMW absorber which includes forming a magnetic composite in which magnetic particles are dispersed in a polymer resin, and disposing a plurality of conductive lines in the magnetic composite.

The method may further include covering the conductive lines with the magnetic composite in which the magnetic particles are dispersed in the polymer resin, and compressively bonding the magnetic composite.

The conductive lines may be periodically arranged at predetermined intervals. The conductive lines may be arranged parallel to a signal line of a device configured to emit EMWs. The conductive lines may be adjusted to have the same linewidth as the signal line.

The disposition of the conductive lines may include arranging a plurality of conductive lines in a first direction, and arranging a plurality of conductive lines in a second direction. The conductive lines arranged in the first direction and the conductive lines arranged in the second direction may form a lattice-type grid. The conductive lines arranged in the first direction may be periodically arranged at predetermined intervals, and the conductive lines arranged in the second direction may be periodically arranged at predetermined intervals. An interval between the conductive lines arranged in the first direction may be adjusted to be equal to an interval between the conductive lines arranged in the second direction. The conductive lines arranged in the first direction may be arranged parallel to a signal line of a device configured to emit EMWs, and the conductive lines arranged in the second direction may be arranged vertical to the signal line of the device configured to emit EMWs.

The plurality of conductive lines arranged parallel to the signal line may be adjusted to have the same linewidth as the signal line.

The conductive lines may be arranged in a central portion between upper and lower portions of the magnetic composite.

The formation of the magnetic composite in which the magnetic particles are dispersed in the polymer resin may include dispersing the polymer resin in a solvent, forming slurry by dispersing the magnetic particles in the solvent in which the polymer resin is dispersed, and forming the magnetic composite by curing the slurry.

Before curing the slurry, the formation of the magnetic composite may further include putting the slurry in a vacuum container and desiccating the slurry by applying a vacuum.

The magnetic particles may contain ferrite-based oxide.

The ferrite-based oxide may contain a spinel ferrite or a hexagonal ferrite.

The spinel ferrite may include a spinel-structured ferrite containing a Ni—Zn ferrite, a Mn—Zn ferrite, or a Cu—Zn ferrite, and the hexagonal ferrite may include a hexagonal-structured ferrite containing a Ba ferrite or a Sr ferrite.

The conductive lines may include a magnetic conductor, which is a Fe-based metal, a Co-based metal, a Ni-based metal, a Mo-based metal, a Mn-based metal, a Nd-based metal, or an alloy thereof.

The conductive lines may include a non-magnetic conductor, which is an Au-based metal, a Ag-based metal, a Cu-based metal, an Al-based metal, a Pt-based metal, a Pd-based metal, or an alloy thereof.

The conductive lines may include at least one kind of carbon-based conductor selected out of CNTs, CNFs, carbon black, carbon fibers, and graphene.

The conductive lines may include an oxide-based conductor or a conductive polymer.

The magnetic particles may be magnetized particles of a Fe-based metal, a Co-based metal, a Ni-based metal, a Mo-based metal, a Mn-based metal, a Nd-based metal, or an alloy thereof.

The magnetic particles may be magnetized particles coated with at least one kind of dielectric material selected out of titanium oxide, barium-titanium oxide, and strontium-titanium oxide.

The magnetic particles may be particles of at least one kind of carbon-based conductor selected out of CNTs, CNFs, carbon black, carbon fiber, and graphene, which are coated with a magnetic body.

The magnetic particles may be spherical particles, plate-type particles, flake-type particles, rod-type particles, or wire-type particles having an aspect ratio of about 1 to about 1000.

The magnetic particles may include hollow spherical particles, hollow tube-type particles, hollow wire-type particles, or hollow flake-type particles.

The magnetic particles may include at least two kinds of particles selected out of spherical particles, plate-type particles, flake-type particles, rod-type particles, wire-type particles, hollow spherical particles, hollow tube-type particles, hollow wire-type particles, and hollow flake-type particles.

The magnetic particles may include a plurality of magnetic particles having different resonant frequencies.

The magnetic particles may be dispersed in the polymer resin, at least one kind of carbon-based conductor selected out of CNTs, CNFs, carbon black, carbon fibers, and graphene may be added, dispersed in the polymer resin, and contained at a content of about 0.01% to about 70% by weight, based on the total weight of the magnetic composite.

A wideband EMW absorber is disclosed that can be used in a device configured to emit EMWs and effectively absorb wideband EMWs.

A wideband EMW absorber can be disposed above, below, or both above and below a signal line of a device configured to emit EMWs and effectively absorb EMWs. In particular, the disclosed wideband EMW absorber can be used to shield wideband EMWs within a range of several GHz from a resonant frequency of a magnetic composite.

In addition, a wideband EMW absorber can be used as a package for packaging a chip (or device) configured to emit EMWs.

Furthermore, a wideband EMW absorber, which is mounted above a printed circuit board (PCB) serving as a device configured to emit EMWs, can shield EMWs, such as noise generated by a circuit line (or signal line), and inhibit interference between circuit lines (or signal lines).

DESCRIPTION

A magnetic composite is disclosed having a structure in which magnetic particles are dispersed in a polymer resin, and a wideband electromagnetic wave (EMW) absorber including a plurality of conductive lines arranged in the magnetic composite.

Furthermore, a method of manufacturing a wideband EMW absorber is disclosed including a step of forming a magnetic composite in which magnetic particles are dispersed in a polymer resin, and a step of disposing a plurality of conductive lines in the magnetic composite.

A wideband electromagnetic wave (EMW) absorber is disclosed including a magnetic composite in which magnetic particles are dispersed in a polymer resin, and a plurality of conductive lines arranged in the magnetic composite.

The conductive lines may include a plurality of conductive lines arranged parallel to a signal line of a device configured to emit EMWs. Although the plurality of conductive lines arranged parallel to the signal line may have a different linewidth from the signal line, the plurality of conductive lines arranged parallel to the signal line preferably have the same linewidth as the signal line.

The conductive lines may include periodically arranged conductive lines or nonperiodically arranged conductive lines. The periodical arrangement of the conductive lines may be advantageous in controlling the efficiency of absorption of EMWs.

Figure 22:
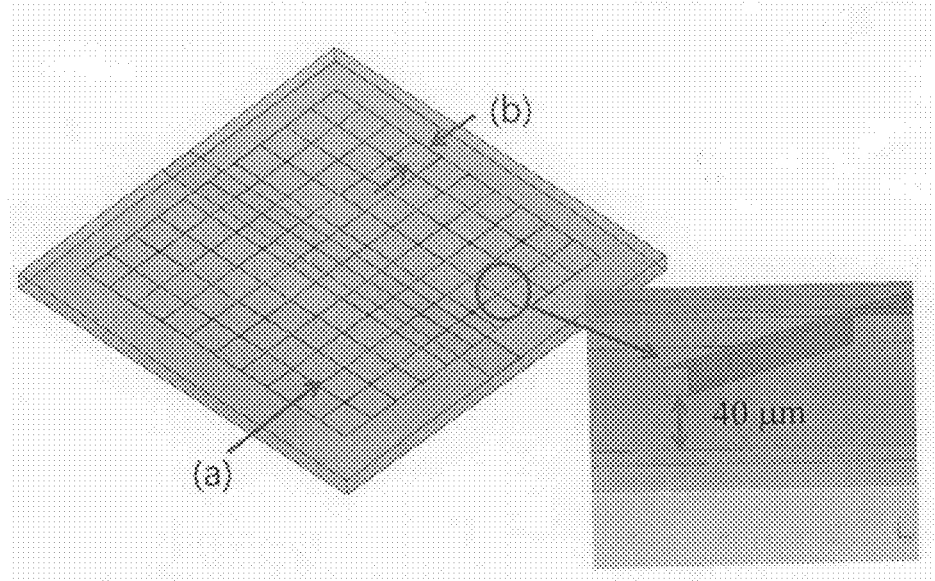
FIG. 22 is a diagram of a structure of a grid composite into which a conductive grid is inserted.

In addition, as shown in FIG. 22, the conductive lines may include a plurality of conductive lines arranged in a first direction, and a plurality of conductive lines arranged in a second direction. The conductive lines arranged in the first direction and the conductive lines arranged in the second direction may form a lattice-type grid. The conductive lines arranged in the first direction may include a plurality of conductive lines periodically arranged at predetermined intervals, and the conductive lines arranged in the second direction may include a plurality of conductive lines periodically arranged at predetermined intervals. Although an interval between the conductive lines arranged in the first direction may be different from an interval between the conductive lines arranged in the second direction, adjusting the interval between the conductive lines arranged in the first direction to be equal to the interval between the conductive lines arranged in the second direction may be advantageous in controlling the efficiency of absorption of EMWs. The conductive lines arranged in the first direction may be arranged parallel to a signal line of a device configured to emit EMWs, and the conductive lines arranged in the second direction may be arranged vertical to the signal line of the device configured to emit EMWs. Although a plurality of conductive lines arranged parallel to the signal line may have a different linewidth from the signal line, adjusting the plurality of conductive lines arranged parallel to the signal line to be equal to that of the signal line may be advantageous in terms of the efficiency of absorption of EMWs. Although the conductive lines arranged in the first direction or the conductive lines arranged in the second direction may include nonperiodically arranged conductive lines, the periodical arrangement of the conductive lines may be advantageous in terms of the efficiency of absorption of EMWs.

The conductive lines may be disposed between upper and lower portions of the magnetic composite and, preferably, arranged in a central portion between the upper and lower portions of the magnetic composite.

In addition, the conductive lines may be formed of a magnetic conductor, which is an iron (Fe)-based metal, a cobalt (Co)-based metal, a nickel (Ni)-based metal, a molybdenum (Mo)-based metal, a manganese (Mn)-based metal, a neodymium (Nd)-based metal, or an alloy thereof.

Furthermore, the conductive lines may be formed of a metal-based conductor, a metal-alloy-based conductor, a carbon-based conductor, an oxide-based conductor, a conductive polymer, or a mixture thereof. The metal-based conductor may be a non-magnetic metal, such as gold (Au), silver (Ag), copper (Cu), aluminum (Al), platinum (Pt), or palladium (Pd). The metal-alloy-based conductor may be a non-magnetic metal alloy containing a metal, such as Au, Ag, Cu, Al, Pt, or Pd. The carbon-based conductor may be a carbon-containing conductive material, such as CNTs, carbon nanofibers (CNFs), carbon black, carbon fibers, graphene, or a mixture thereof. The oxide-based conductor may be a conductive oxide, such as chromium oxide ($CrO_2$).

The magnetic particles may not be specifically limited but may be any magnetized particles having a size of about 1 nm to about nm, preferably, a size of about 10 μm to about 20 μm.

The magnetic particles may include a ferrite-based oxide. The ferrite-based oxide may be a spinel ferrite or a hexagonal ferrite. The spinel ferrite may be, for example, a spinel-structured ferrite, such as a nickel-zinc (Ni—Zn) ferrite, a manganese-zinc (Mn—Zn) ferrite, or a copper-zinc (Cu—Zn) ferrite, and the hexagonal ferrite may be, for example, a hexagonal-structured ferrite, such as a barium (Ba) ferrite or a strontium (Sr) ferrite.

In addition, the magnetic particles may be magnetized particles, such as particles of a Fe-based metal, a Co-based metal, a Ni-based metal, a Mo-based metal, a Mn-based metal, a Nd-based metal, or an alloy thereof.

Furthermore, the magnetic particles may be magnetic particles coated with at least one kind of dielectric material selected out of titanium oxide, barium-titanium oxide, and strontium-titanium oxide. In this case, the coated thickness of the dielectric material may be controlled according to the size of the magnetized particles. Preferably, the dielectric material may be coated to a thickness of about 1 nm to about 1 μm in consideration of the size of the magnetized particles.

Furthermore, the magnetic particles may be particles of at least one kind of carbon-based conductor selected out of CNTs, CNFs, carbon black, carbon fiber, and graphene, which are coated with a magnetic body. The magnetic body may be a Fe-based metal, a Co-based metal, a Ni-based metal, a Mo-based metal, a Mn-based metal, a Nd-based metal, or an alloy thereof. In this case, the coated thickness of the magnetic body may be controlled according to the size of the carbon-based conductor. Preferably, the magnetic body may be coated to a thickness of about 50 nm to about 5 μm in consideration of the size of the carbon-based conductor.

The magnetic particles may contain spherical particles, plate-type particles, flake-type particles, rod-type particles, or wire-type particles having an aspect ratio of about 1 to about 1000. Also, the magnetic particles may contain hollow spherical particles, hollow tube-type particles, hollow wire-type particles, or hollow flake-type particles. The magnetic particles may contain at least two kinds of particles selected out of spherical particles, plate-type particles, flake-type particles, rod-type particles, wire-type particles, hollow spherical particles, hollow tube-type particles, hollow wire-type particles, and hollow flake-type particles. When at least two kinds of particles having different shapes are used, EMWs having a broader band may be absorbed. The magnetic particles are preferably contained at a content of about 3 to 80 parts by weight based on 100 parts by weight polymer resin. When the magnetic particles are contained at a content of less than about 3 parts by weight, magnetic properties of a magnetic composite may be degraded. When the magnetic particles are contained at a content of more than about 80 parts by weight, stability of particles may be degraded due to an excessive magnetic body, non-uniform dispersion of particles in a polymer resin may be caused, and the weight of the magnetic composite may increase.

The magnetic particles may include a plurality of magnetic particles having different resonant frequencies. For example, a mixture of magnetic particles having a resonant frequency of about 0.5 GHz, and magnetic particles having a resonant frequency of about 1 GHz may be used as the magnetic particles. When the plurality of magnetic particles having different resonant frequencies are used, EMWs having a much broader band may be absorbed.

Furthermore, at least one kind of carbon-based conductor selected out of CNTs, CNFs, carbon black, carbon fibers, and graphene may be dispersed in the polymer resin. The carbon-based conductor is preferably contained at a content of about 0.01 to 70% by weight, preferably about 0.5 to 10% by weight, based on the total weight of the magnetic composite. When the content of the carbon-based conductor exceeds the content range, electrical conductivity may increase, and shielding characteristics may become stronger than EMW absorbing characteristics. Therefore, the carbon-based conductor is preferably contained within the above-described content range.

The polymer resin may be a thermoplastic or thermosetting resin without any particular limitation. For example, the polymer resin may be a resin, such as epoxy, silicone rubber, polyurethane, polyethylene, polyethylene terephthalate (PET), polyestersulfone (PES), polyarylate (PAR), polyimide (PI), or polycarbonate (PC).

In a wideband EMW absorber, the size and shape of the magnetic particles are controlled to determine the resonant frequency of the magnetic composite, and absorption of EMWs occurs in a frequency band equal to or higher than the resonant frequency. For instance, later-described experiments demonstrated that when the resonant frequency of the magnetic composite is about 1 GHz, the wideband EMW absorber was very effective in absorbing EMWs having a wide frequency band of about 1 to 5 GHz.

A disclosed wideband EMW absorber includes forming a magnetic composite by dispersing magnetic particles in a polymer resin, and disposing a plurality of conductive lines in the magnetic composite. Here, the 'disposing' of the plurality of conductive lines in the magnetic composite is used as a concept including all various methods of arranging the conductive lines in the magnetic composite. For example, the disposing of the plurality of conductive lines in the magnetic composite is used as a concept including printing conductive lines in a magnetic composite, inserting conductive lines into a magnetic composite, mounting conductive lines on a magnetic composite and compressively bonding the conductive lines to the magnetic composite, or forming conductive line patterns on a magnetic composite using a photolithography process, and forming the conductive lines using various methods, such as electroplating and deposition processes. When it is intended that conductive lines are arranged in a central portion between upper and lower portions of the magnetic composite, the manufacture of the wideband EMW absorber may further include covering top portions of the conductive lines with a magnetic composite containing magnetic particles dispersed in a polymer resin, and compressively bonding the magnetic composite to the conductive lines.

A method of manufacturing a wideband EMW absorber according to an exemplary embodiment may include dispersing a polymer resin in a solvent, forming a slurry by dispersing magnetic particles containing a ferrite-based oxide in the solvent in which the polymer resin is dispersed, forming a magnetic composite by curing the slurry, disposing a plurality of conductive lines on the magnetic composite, and covering a top portion of the magnetic composite on which the conductive lines are disposed, with a magnetic composite and compressively bonding the magnetic composite. Before curing the slurry, the method of manufacturing the wideband EMW absorber may further include putting the slurry in a vacuum container and desiccating the slurry by applying a vacuum.

The conductive lines are preferably periodically arranged at predetermined intervals. The conductive lines are preferably arranged parallel to a signal line of a device configured to emit EMWs. A linewidth of the conductive lines is preferably adjusted to be equal to the linewidth of the signal line.

The disposition of the conductive lines may include arranging a plurality of conductive lines in a first direction, and arranging a plurality of conductive lines in a second direction. The conductive lines arranged in the first direction and the conductive lines arranged in the second direction may form a lattice-type grid. The conductive lines arranged in the first direction are preferably periodically arranged at predetermined intervals, and the conductive lines arranged in the second direction are also preferably periodically arranged in the second direction. An interval between the conductive lines arranged in the first direction is preferably adjusted to be equal to an interval between the conductive lines arranged in the second direction. The conductive lines arranged in the first direction are preferably arranged parallel to a signal line of a device configured to emit EMWs, and the conductive lines arranged in the second direction are preferably arranged vertical to the signal line of the device configured to emit EMWs. The plurality of conductive lines arranged parallel to the signal line are preferably adjusted to have the same linewidth as the signal line.

The magnetic composite in which magnetic particles are dispersed in a polymer resin may be manufactured in various ways without any particular limitation. For example, the manufacture of the magnetic composite may include adding a desired quantity of magnetic particles to a polymer resin, uniformly dispersing the magnetic particles in the polymer resin using a homo mixer, an ultrasonic processor, or a 3-roll mill, and forming a film using a film casting apparatus. Also, the manufacture of the magnetic composite may include forming an emulsion by adding magnetic particles to an organic solvent containing a polymer, and removing the organic solvent from the emulsion.

The conductive lines may be formed using various methods without any particular limitation. For example, the formation of the conductive lines may include forming a mask using a photolithography technique or a laser processing technique, forming conductive line patterns using chromium (Cr) or chromium oxide (CrO) on a nonconductive resin, and plating the conductive line patterns formed of Cr or CrO with nickel (Ni) or copper (Cu) using a plating process.

A wideband EMW absorber may be manufactured using various methods of arranging conductive lines on a magnetic composite without any particular limitation. For example, the manufacture of the wideband EMW absorber may include inserting conductive lines into a magnetic composite. Alternatively, the manufacture of the wideband EMW absorber may include mounting conductive lines on a magnetic composite and compressively bonding (or pressing) the conductive lines. When the conductive lines are formed in a central portion of the magnetic composite, the manufacture of the wideband EMW absorber may include mounting conductive lines on a magnetic composite, putting another magnetic composite on the conductive lines, and compressively bonding (or pressing) the magnetic composite. Alternatively, the manufacture of the wideband EMW absorber may include putting a resin mixture to which magnetic particles are added, on conductive lines, and forming a film using a film casting technique.

Furthermore, a wideband EMW absorber may be manufactured by directly forming conductive lines on a magnetic composite. For example, the manufacture of the wideband EMW absorber may include printing conductive lines on a magnetic composite using an inkjet print process or a silk screen process, or forming conductive lines on a magnetic composite using photolithography and deposition processes.

Figure 1:
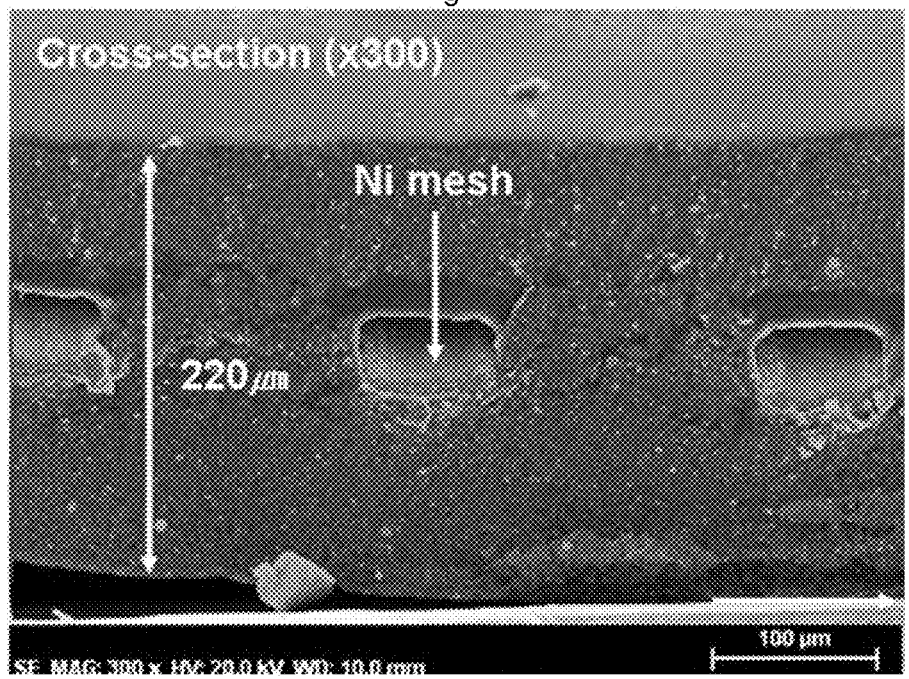
FIG. 1 is a sectional scanning electron microscope (SEM) image of a disclosed wideband electromagnetic (EMW) absorber.

FIG. 1 is a sectional scanning electron microscope (SEM) image of a wideband electromagnetic (EMW) absorber. In FIG. 1, 'Ni mesh' refers to a conductive line manufactured in a mesh shape using nickel (Ni). The wideband EMW absorber shown in FIG. 1 is manufactured by putting a silicon rubber mixture containing dispersed nickel-iron (Ni—Fe) particles (containing Ni and Fe at a weight ratio of 1:1) on a releasing film, putting a Ni mesh on the silicon rubber mixture, covering the Ni mesh with a silicon rubber mixture containing dispersed Ni—Fe particles, and compressively bonding the silicon rubber mixtures to the Ni mesh under a pressure of about 2 tons at a temperature of about 120° C. for about 15 minutes. Referring to FIG. 1, it can be observed that the Ni mesh is disposed in a central portion of the wideband EMW absorber.

Figure 78:
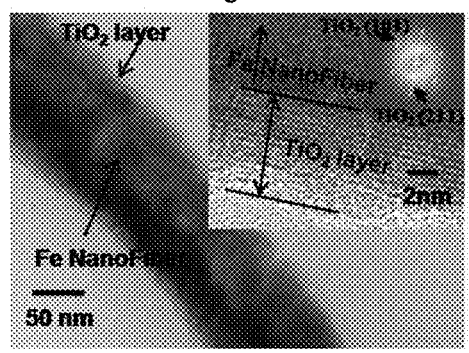
FIG. 78 is a transmission electron microscope (TEM) image of magnetic particles obtained by coating iron (Fe) fibers with titanium oxide.

FIG. 78 is a transmission electron microscope (TEM) image of magnetic particles obtained by coating iron (Fe) fibers with titanium oxide ($TiO_2$). Magnetic particles coated with titanium oxide ($TiO_2$) shown in FIG. 78 were formed using the following method. The Fe oxide fibers were coated with a titanium isopropoxide (TTIP) solution serving as a Ti precursor while controlling the concentration of the TTIP solution. Titanium oxide was formed by calcining the TTIP solution at a temperature of about 800° C. for about 1 hour, and only Fe oxide was selectively reduced using a reduction process in an atmosphere of hydrogen ($H_2$) gas at a temperature of about 500° C. for 1 hour. When magnetic particles are coated with a dielectric material as described above, the dielectric constant and permeability of the magnetic particles may be controlled.

Figure 79:
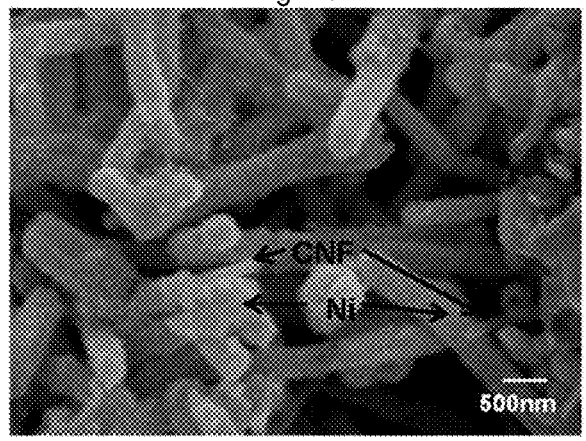
FIG. 79 is a SEM image of magnetic particles obtained by coating carbon (C) nanofibers with Ni.

FIG. 79 is a TEM image of magnetic particles obtained by coating CNFs serving as a carbon-based conductor with Ni serving as a magnetic body. Magnetic particles obtained by coating CNFs with nickel (Ni) shown in FIG. 79 were formed using the following method. CNFs were coated with Ni using an electroless plating process, and a magnetic coating layer having a noncrystalline structure was crystallized using an annealing process in an atmosphere of argon (Ar) gas at a temperature of about 450° C. for 1 hour to improve magnetism. When a C-based conductor is coated with a magnetic body, magnetic particles having a high aspect ratio may be used.

Figure 80:
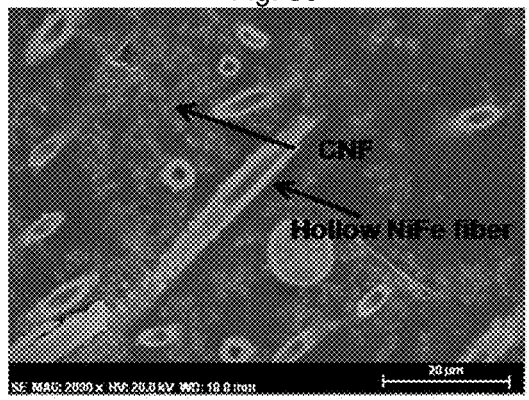
FIG. 80 is a SEM image of a composite in which hollow Ni—Fe fibers and carbon nanofibers (CNFs) are mixed.

FIG. 80 is a SEM image of a composite in which hollow Ni—Fe fibers serving as magnetic particles and CNFs serving as a carbon-based conductor are mixed. An epoxy resin was used as a polymer resin of the composite in which the Ni—Fe fibers and CNFs were mixed, as shown in FIG. 80.

The wideband EMW absorber manufactured may be located on, under, or both on and under a signal line of a device configured to emit EMWs and efficiently absorb EMWs. In particular, the wideband EMW absorber manufactured may be used to absorb (shield) wideband EMWs within a range of several GHz from a resonant frequency of a magnetic composite. Also, the wideband EMW absorber may be used as a package for packaging a chip (device) configured to emit EMWs. Furthermore, the wideband EMW absorber may be mounted on a printed circuit board (PCB) serving as a device configured to emit EMWs, and used to shield EMWs, such as noise generated by circuit lines (or signal lines), and inhibit interference between the circuit lines (or signal lines).

Hereinafter, an example of a method of manufacturing a magnetic composite will be described, and a method of manufacturing a wideband EMW absorber using the method will be described in further detail.

6 g of thermoplastic polyurethane (hereinafter, referred to as 'TPU') was added to 56 g of a mixture of dimethylformamide (hereinafter, referred to as 'DMF') with acetone (here, a weight ratio of DMF to acetone is 7:3), and the mixture was stirred using a magnetic stirrer at room temperature at a stir rate of about 500 rpm for about 3 hours to completely dissolve TPU in the mixture.

After magnetic particles were put in a solution in which TPU was dissolved, a slurry was prepared using a mechanical dispersion method. Nanoscale barium (Ba)-ferrite powder (containing about 50% by weight barium) having an average particle size of about 200 nm was used as the magnetic particles. In another example, microscale Ba-ferrite (containing about 50% by weight barium) having an average particle size of about 20 μm was used.

The mechanical dispersion method adopted a calendaring method using a 3-roll mill and a method using a homomixer. The calendaring method was performed using a 3-roll mill in which a gap between rolls is about 5 μm, at a roll speed of about 200 rpm, and repeated five times at a temperature of about 25° C. The method using the homomixer was performed at an agitation speed of about 3000 rpm to about 5000 rpm at a temperature of about 25° C. for about 10 minutes.

The prepared slurry was desiccated at room temperature for about 25 minutes to about 30 minutes. The desiccation process included putting the slurry in a vacuum container and applying a vacuum of about $10^{-2}$ Torr to about $10^{-1}$ Torr.

A film casting process was performed on the desiccated slurry using a comma roll, and the formed film was cured at room temperature for about 24 hours, thereby manufacturing a magnetic composite in which magnetic particles were dispersed in a TPU resin.

Figure 81:
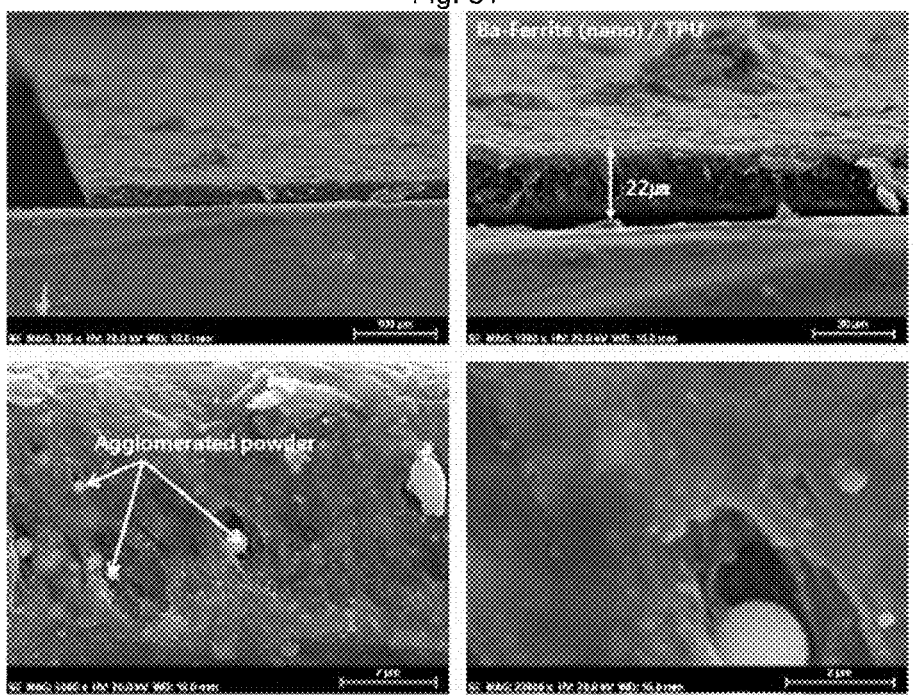
FIG. 81 is a SEM image of a magnetic composite obtained by dispersing barium (Ba) ferrite powder with an average size of about 200 nm as magnetic particles in a thermoplastic polyurethane (TPU) resin.
Figure 82:
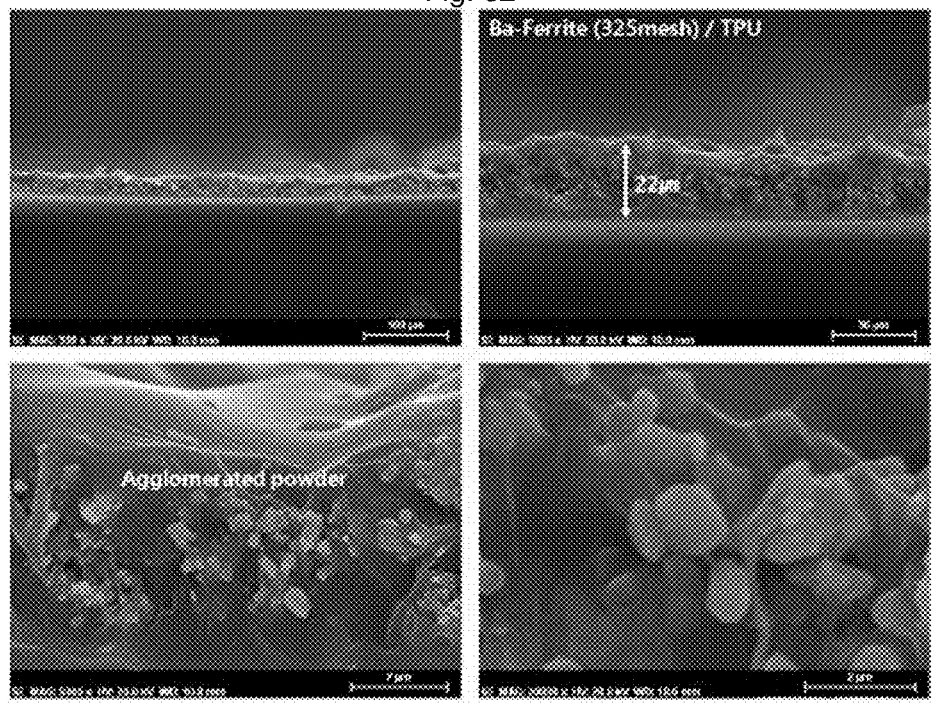
FIG. 82 is a SEM image of a magnetic composite obtained by dispersing Ba-ferrite powder with an average size of about 20 μm as magnetic particles in a TPU resin.

FIG. 81 is a SEM image of a magnetic composite obtained by dispersing barium (Ba) ferrite powder with an average size of about 200 nm as magnetic particles in a thermoplastic polyurethane (TPU) resin, and FIG. 82 is a SEM image of a magnetic composite obtained by dispersing Ba-ferrite powder with an average size of about 20 µm as magnetic particles in a TPU resin. Four images of FIG. 81 were captured by varying magnification, and four images of FIG. 82 were also captured by varying magnification.

Figure 83:
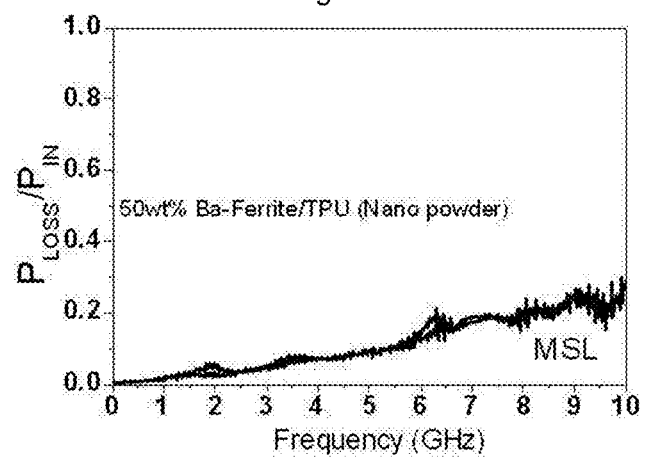
FIG. 83 is a graph showing absorbing power of a magnetic composite obtained by dispersing Ba-ferrite powder with an average size of about 200 nm as magnetic particles in a TPU resin.
Figure 84:
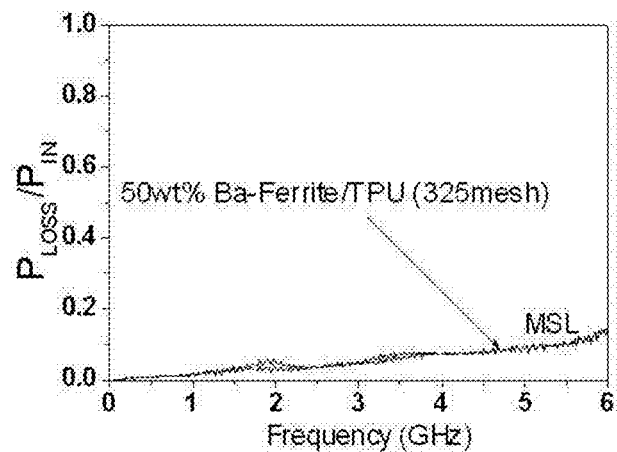
FIG. 84 is a graph showing absorbing power of a magnetic composite obtained by dispersing Ba-ferrite powder with an average size of about 20 μm as magnetic particles in a TPU resin.

FIG. 83 is a graph showing absorbing power of a magnetic composite obtained by dispersing Ba-ferrite powder with an average size of about 200 nm as magnetic particles in a TPU resin, and FIG. 84 is a graph showing absorbing power of a magnetic composite obtained by dispersing Ba-ferrite powder with an average size of about 20 µm as magnetic particles in a TPU resin.

Hereinafter, an example of a process of manufacturing a wideband EMW absorber using the magnetic composite manufactured as described above will be described.

A peel ply serving as a release agent was stacked on a steel us (vs.) stainless (SUS) plate, and the magnetic composite having a structure in which the magnetic particles were dispersed in the TPU resin was stacked thereon. The release agent serves to easily separate the SUS plate from the magnetic composite after a later-described compressive bonding process.

A lattice-type grid formed of Ni was stacked on the stacked magnetic composite, and the magnetic composite was stacked on the lattice-type grid.

The sequentially stacked magnetic composite, lattice-type grid, and magnetic composite were compressively bonded to one another using a hot press, thereby manufacturing the wideband EMW absorber. The compressive bonding process was performed at a temperature of about 120° C. under a pressure of 1 ton for about 1 hour.

Figure 85:
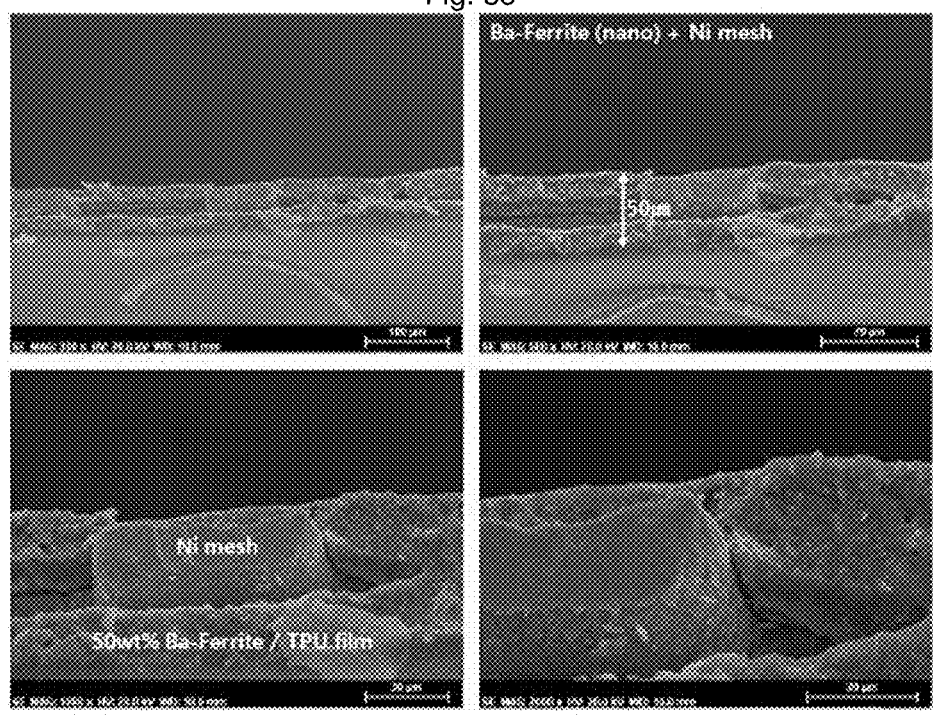
FIG. 85 is a SEM image of a wideband EMW absorber manufactured using a magnetic composite obtained by dispersing Ba-ferrite powder with an average size of about 200 nm as magnetic particles in a TPU resin and a Ni-based lattice-type grid.
Figure 86:
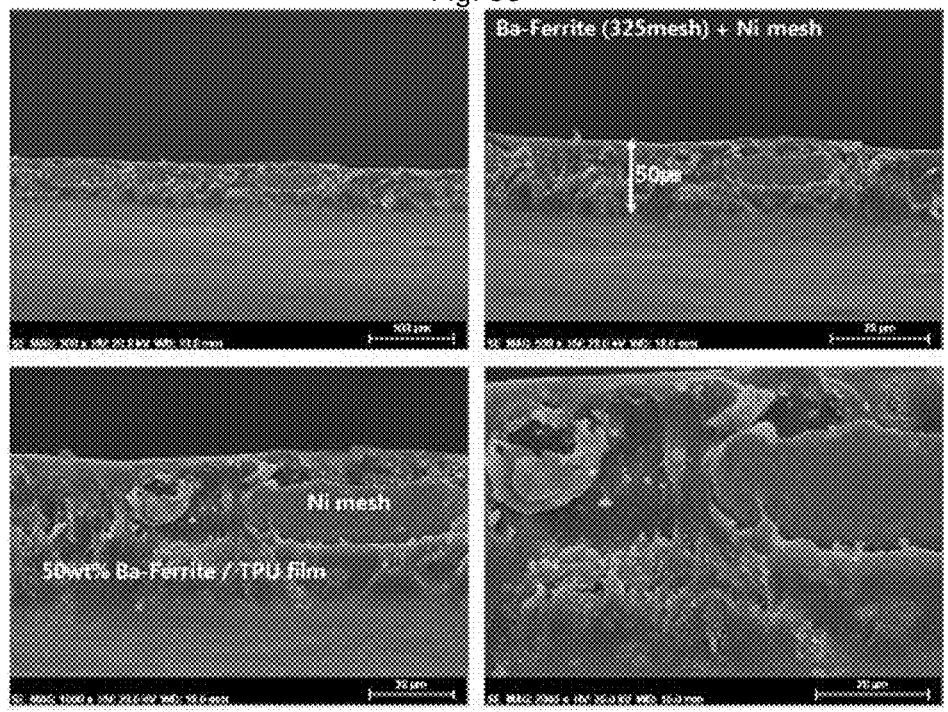
FIG. 86 is a SEM image of a wideband EMW absorber manufactured using a magnetic composite obtained by dispersing Ba-ferrite powder with an average size of about 20 μm in a TPU resin and a Ni-based lattice-type grid.

FIG. 85 is a SEM image of a wideband EMW absorber manufactured using a magnetic composite obtained by dispersing Ba-ferrite powder with an average size of about 200 nm as magnetic particles in a TPU resin and a Ni-based lattice-type grid, and FIG. 86 is a SEM image of a wideband EMW absorber manufactured using a magnetic composite obtained by dispersing Ba-ferrite powder with an average size of about 20 µm in a TPU resin and a Ni-based lattice-type grid. Four images of FIG. 85 were captured by varying magnification, and four images of FIG. 86 were also captured by varying magnification.

Figure 87:
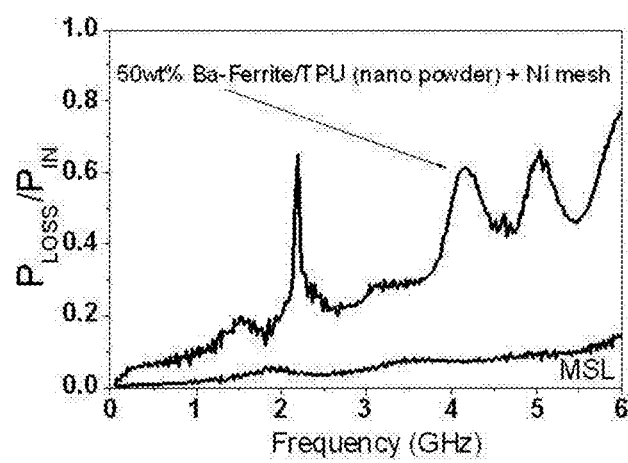
FIG. 87 is a graph showing absorbing power of a wideband EMW absorber manufactured using a magnetic composite obtained by dispersing Ba-ferrite powder with an average size of about 200 nm as magnetic particles in a TPU resin and a Ni-based lattice-type grid.
Figure 88:
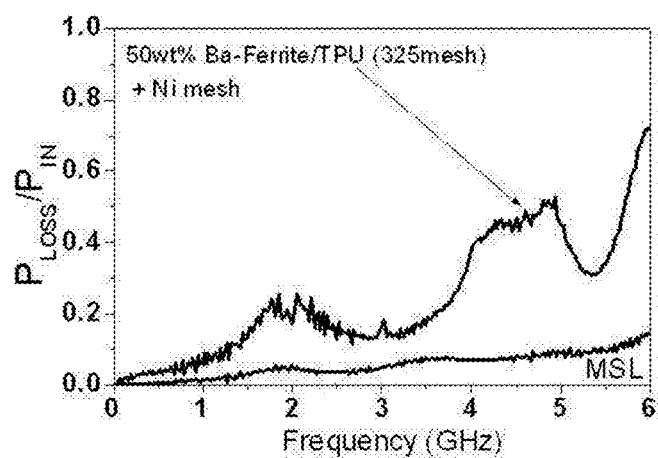
FIG. 88 is a graph showing absorbing power of a wideband EMW absorber manufactured using a magnetic composite obtained by dispersing Ba-ferrite powder with an average size of about 20 μm in a TPU resin and a Ni-based lattice-type grid.

FIG. 87 is a graph showing absorbing power of a wideband EMW absorber manufactured using a magnetic composite obtained by dispersing Ba-ferrite powder with an average size of about 200 nm as magnetic particles in a TPU resin and a Ni-based lattice-type grid, and FIG. 88 is a graph showing absorbing power of a wideband EMW absorber manufactured using a magnetic composite obtained by dispersing Ba-ferrite powder with an average size of about 20 µm in a TPU resin and a Ni-based lattice-type grid.

When comparing FIG. 83 with FIG. 87, it can be confirmed that the wideband EMW absorber manufactured using the nanoscale magnetic composite and the lattice-type grid had improved absorbing power. Also, when comparing FIG. 84 with FIG. 88, it can be confirmed that the wideband EMW absorber manufactured using the microscale magnetic composite and the lattice-type grid had improved absorbing power.

Figure 89:
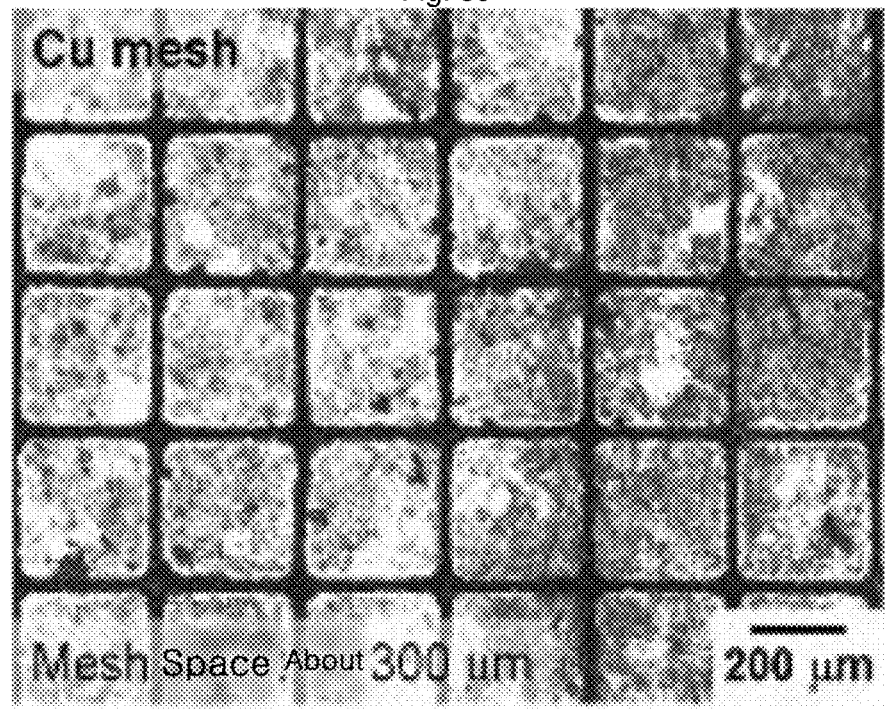
FIG. 89 is an image of a wideband EMW absorber manufactured using a magnetic composite obtained by dispersing Ni—Fe nanopowder with a particle size of about 200 nm or less in silicone rubber and a Cu-based lattice-type grid.

FIG. 89 is an image of a wideband EMW absorber manufactured using a magnetic composite obtained by dispersing Ni—Fe nanopowder (containing Ni and Fe at a weight ratio of 52 to 48) with a particle size of about 200 nm or less in silicone rubber (a Dow Corning product having a viscosity of about 800 cps and a density of about 0.97 g/cm$^3$) and a Cu-based lattice-type grid. A curing process for forming the magnetic composite was performed at a temperature of about 120° C. for about 20 minutes.

Figure 90:
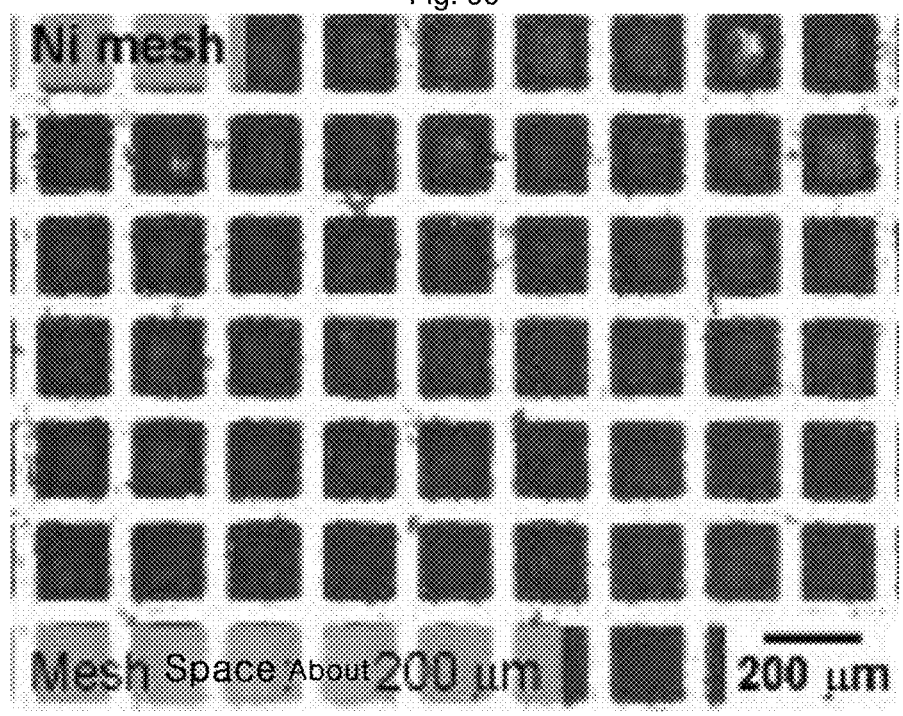
FIG. 90 is an image of a wideband EMW absorber manufactured using Ni—Fe nanopowder with a particle size of about 200 nm or less in silicone rubber and a Ni-based lattice-type grid.

FIG. 90 is an image of a wideband EMW absorber manufactured using Ni—Fe nanopowder (containing Ni and Fe at a weight ratio of 52 to 48) with a particle size of about 200 nm or less in silicone rubber (a Dow Corning product having a viscosity of about 800 cps and a density of about 0.97 g/cm$^3$) and a Ni-based lattice-type grid. A curing process for forming the magnetic composite was performed at a temperature of about 120° C. for about 20 minutes.

Hereinafter, experimental examples will be represented in detail to demonstrate that a wideband EMW absorber may be used as an absorber capable of absorbing (or shielding) wideband EMWs, and this disclosure is not limited by the following experimental examples. Hereinafter, the term 'grid composite' refers to a wideband EMW absorber in which conductive lines are formed as a grid type. Also, the term 'Cu grid' refers to a grid formed of copper (Cu), and the term 'Ni grid' refers to a grid formed of nickel (Ni). In the following experimental examples, 200-nm Ni—Fe particles were used as magnetic particles of the magnetic composite, and epoxy, silicone rubber, or polyurethane was used as a polymer resin of the magnetic composite.

Development of an EMW absorber using a magnetic composite in which magnetic particles are contained in a resin has progressed toward adjusting the material and shape of magnetic particles to control permeability and a dielectric constant and, also toward adjusting the content and orientation of particles in the composite to obtain high EMW absorbing power in a desired frequency band.

When a path through which an induced current may flow is provided by inserting a mesh-type conductive grid into a magnetic composite thin layer, additional dielectric loss may be generated, and much higher magnetic loss may be generated in the entire region of the thin layer because EMWs may be dispersed along the grid throughout the thin layer. Also, since the structure and size of the conductive grid may be changed freely, characteristics of the magnetic composite into which the conductive grid is inserted may be easily controlled, and an EMW absorber having high absorbing power may be obtained.

Hereinafter, some factors (e.g., permeability, dielectric constant, and size) that affect the EMW absorbing power of the magnetic composite will be firstly examined, and effects of some factors (e.g., material, size, and position of the conductive grid) will then be described.

(1) EMW Analysis Model Using Finite Element Method (FEM)

Figure 2:
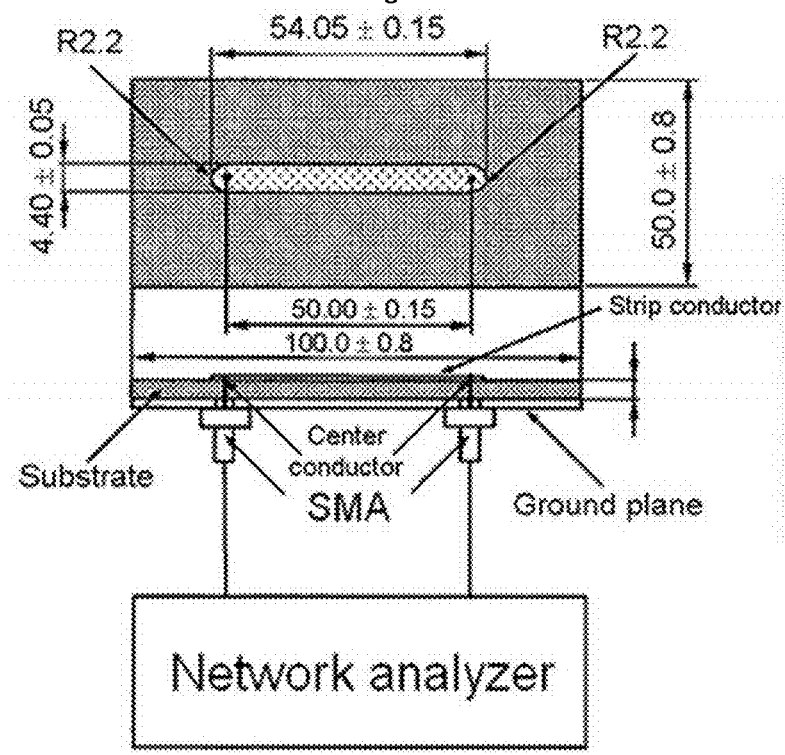
FIG. 2 is a standard diagram of an IEC standard 62333-2 microstrip line for measuring conductive noise.

To analyze near-field EMW absorbing characteristics, a model for a microstrip line (MSL) adopted based on IEC 62333 was established, and theoretical analysis was performed. FIG. 2 is a standard diagram of a microstrip line having a signal line with a width of about 4.4 mm and a length of about 50 mm. A magnetic composite is located on the signal line, a vector network analyzer is connected to the magnetic composite, and a s-parameter is measured to obtain absorbing power. Absorbing power or power loss is given by $P_{Loss}/P_{In}=1-|S_{11}|^2-|S_{21}|^2$ from a reflection coefficient $S_{11}$ and a transmission coefficient $S_{21}$.

Figure 3:
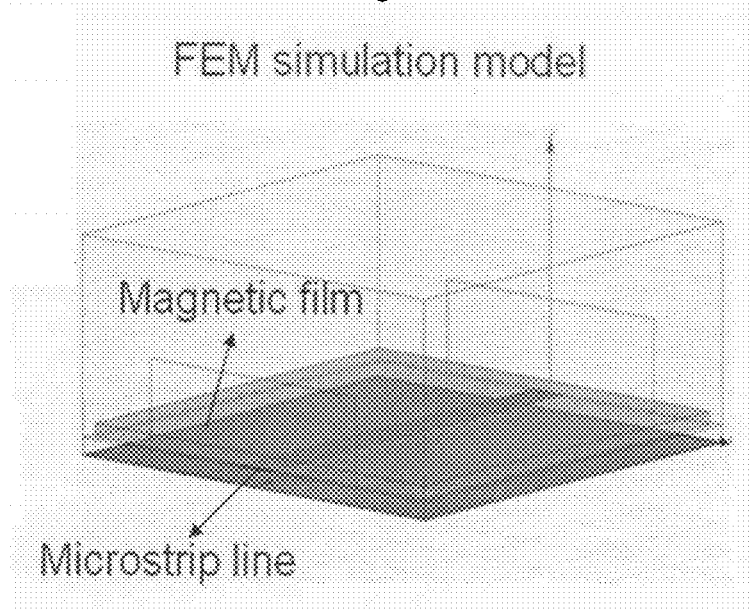
FIG. 3 is a diagram of a finite element analysis (FEA) model.
Figure 4:
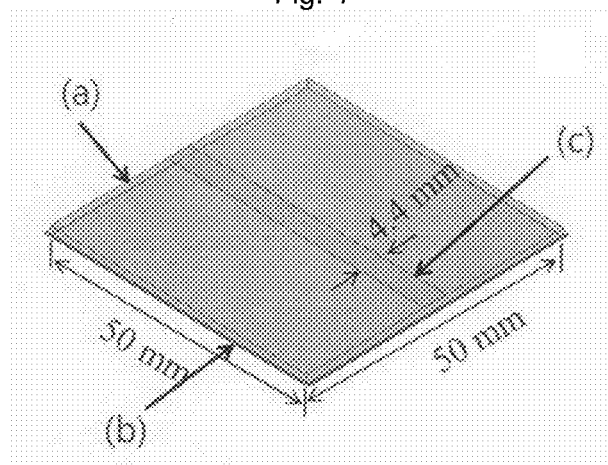
FIG. 4 is a diagram of a standard for a microstrip line having a characteristic impedance of about 50Ω.

A model (FEM simulation model) for making an analysis of EMW absorbing characteristics using the microstrip line by the analysis of EMWs using an FEM is shown in FIG. 3. The magnetic composite (refer to a magnetic film of FIG. 3) was located on the microstrip line (refer to FIG. 3), and analysis was performed in an air box with a finite size under non-reflecting boundary conditions. Material and detailed standard of the microstrip line were designed to have a characteristic impedance of about 50Ω as shown in FIG. 4. The magnetic composite had a size of 48 mm(w)×48 mm(l)× 100 μm(t), and a 2-μm air layer was put between a signal line of the microstrip line and the magnetic composite to insulate the signal line of the microstrip line and the magnetic composite from each other. In FIG. 4, (a) shows a polytetrafluoroethylene (PTFE) substrate having a dielectric constant ∈r of about 2.5 and a thickness of 1.6 mm, (b) shows a bottom ground formed of copper (Cu) to a thickness of about 18 μm, and (c) shows a signal line formed of Cu to a thickness of about 18 μm.

(2) Analysis of EMW Absorbing Characteristics of Magnetic Composite

Figure 5:
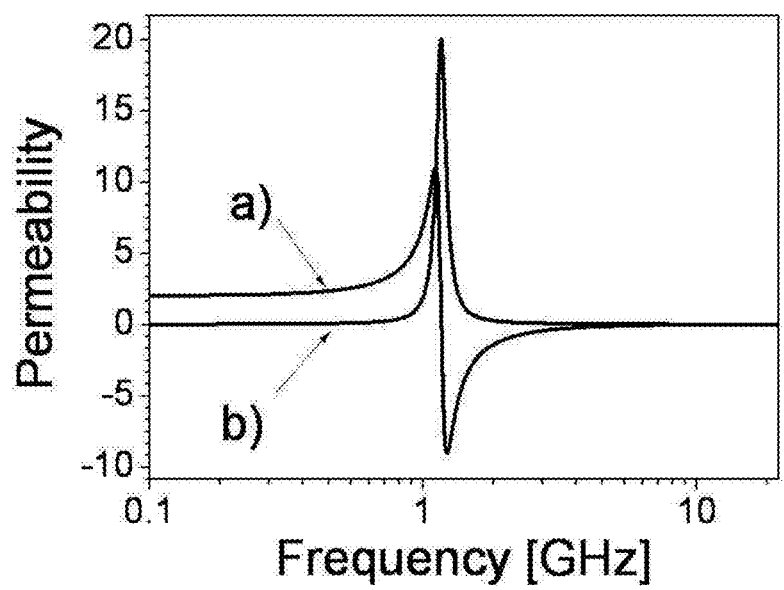
FIG. 5 is a graph of complex permeability of a typical ferromagnetic material.

A) Analysis of EMW Absorbing Power Relative to Variations in Magnetic Complex Permeability and Complex Dielectric Constant Complex permeability ($\mu r=\mu'-j\mu''$) is one of the most significant characteristics in estimating an EMW absorber. EMW absorbing characteristics with respect to the influence of a variation in permeability upon absorbing power were modeled by respectively or simultaneously increasing or reducing a real part and an imaginary part of permeability based on the complex permeability of a ferromagnetic material having resonant absorbing characteristics at a frequency of about 1 GHz, as shown in FIG. 5. In FIG. 5, (a) indicates the permeability of the real part, and (b) indicates the permeability of the imaginary part.

Figure 6:
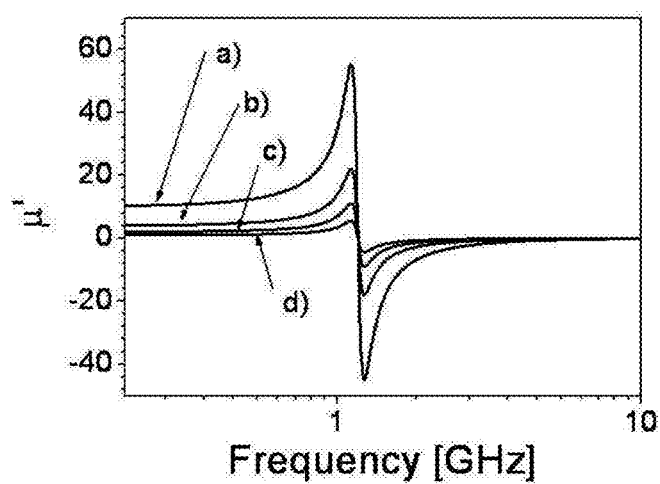
FIG. 6 is a graph of a real part of permeability applied to estimation.
Figure 7:
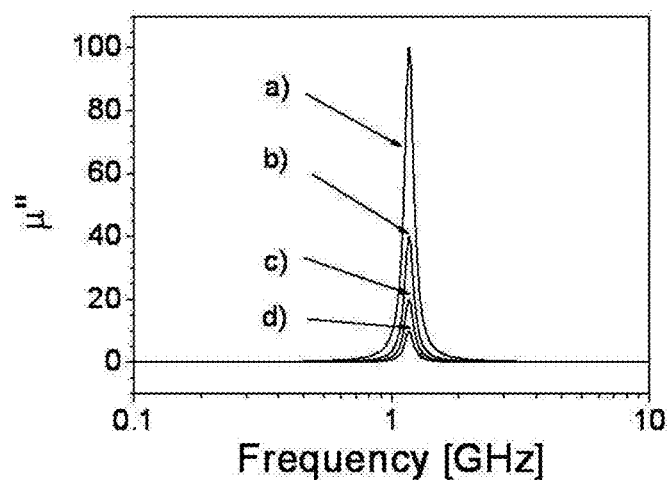
FIG. 7 is a graph of an imaginary part of permeability applied to estimation.

Variations in permeability of the real and imaginary parts used for the estimation of absorbing power are shown in FIGS. 6 and 7, respectively. Values obtained before resonance occurs were described as values of the real part of the permeability, and the maximum values obtained at a frequency at which resonance occurs were used as values of the imaginary part. It is assumed here that real and imaginary parts of dielectric constants have constant values irrespective of a variation in frequency. When a composite is used as a near-field EMW absorber, since near-field absorbing characteristics are dominated by permeability more than the dielectric constant of the composite, real and imaginary parts of a complex dielectric constant were respectively fixed to 1 and 0, which are constants free from frequency characteristics, on the assumption that the dielectric loss of the absorber is negligible. In FIG. 6, (a) shows a case where $\mu'$ is 10, (b) shows a case where $\mu'$ is 4, (c) shows a case where $\mu'$ is 2, and (d) shows a case where $\mu'$ is 1. In FIG. 7, (a) shows a case where $\mu''$ is 100, (b) shows a case where $\mu''$ is 40, (c) shows a case where $\mu''$ is 20, and (d) shows a case where $\mu''$ is 10.

Figure 8:
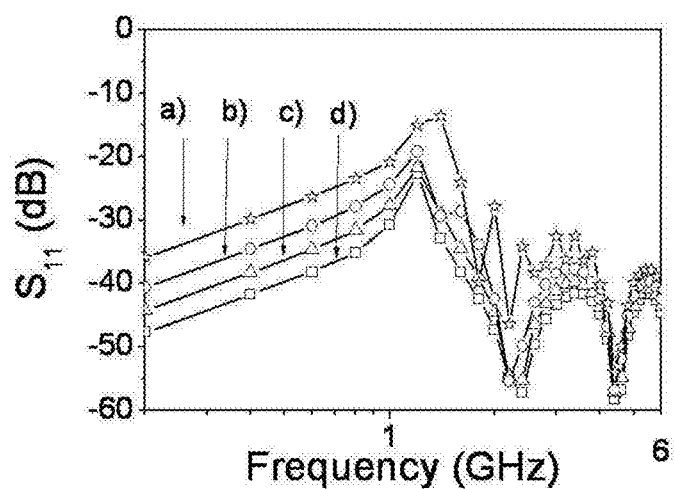
FIG. 8 is a graph showing a reflection coefficient when a real part of complex permeability is changed.
Figure 9:
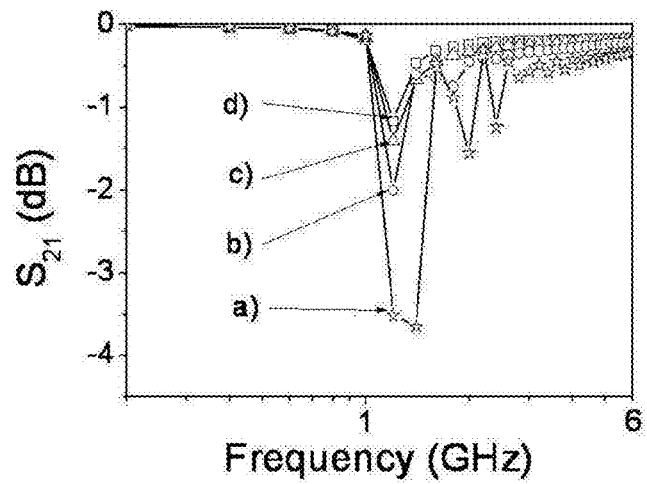
FIG. 9 is a graph showing a transmission coefficient when a real part of complex permeability is changed.

When the imaginary part of the complex permeability is fixed and the real part thereof is changed, a reflection coefficient and a transmission coefficient vary as shown in FIGS. 8 and 9, respectively. In FIGS. 8 and 9, (a) shows a case where permeability ($\mu'$, $\mu''$) is (10,20), (b) shows a case where permeability ($\mu'$, $\mu''$) is (4,20), (c) shows a case where permeability ($\mu'$, $\mu''$) is (2,20), and (d) shows a case where permeability ($\mu'$, $\mu''$) is (1,20). It can be seen that as the real part of the permeability increases, the reflection coefficient increases in a resonant frequency region and at a frequency lower than a resonant frequency, and the transmission coefficient sharply increases in the resonant frequency region. Since the transmission coefficient is about ten times higher than the reflection coefficient, power loss is dominantly affected by the transmission coefficient.

Figure 10:
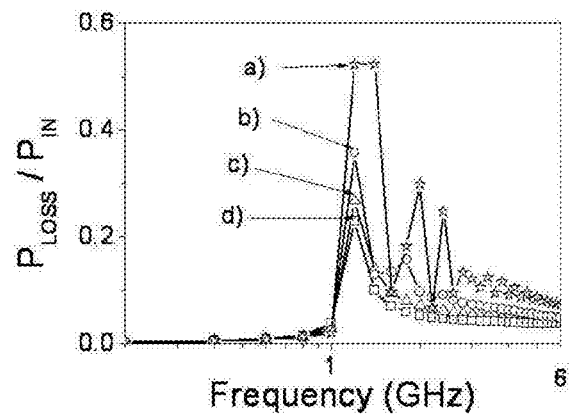
FIG. 10 is a graph showing a variation in absorbing power relative to a variation in a real part of complex permeability.

As shown in FIG. 10, absorbing power exhibits low insertion loss in a region lower than a ferromagnetic resonant frequency, and becomes high in the resonant frequency region. Since power loss is proportional to frequency, even if permeability is low in a high frequency region, a relatively high absorbing power is exhibited in a low frequency region. As the real part of the permeability increases, absorbing power tends to increase. In FIG. 10, (a) shows a case where permeability ($\mu'$, $\mu''$) is (10,20), (b) shows a case where permeability ($\mu'$, $\mu''$) is (4,20), (c) shows a case where permeability ($\mu'$, $\mu''$) is (2,20), and (d) shows a case where permeability ($\mu'$, $\mu''$) is (1,20).

Figure 11:
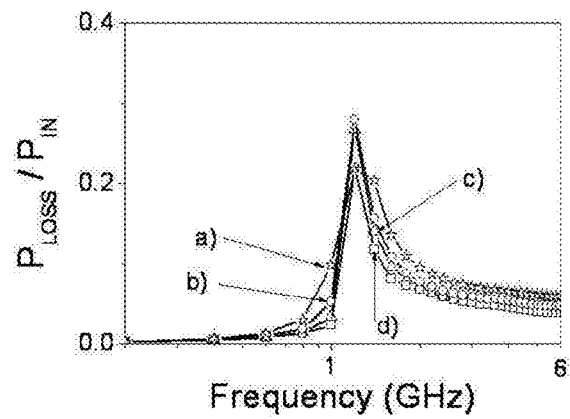
FIG. 11 is a graph showing a variation in absorbing power with an increase in an imaginary part of complex permeability.
Figure 12:
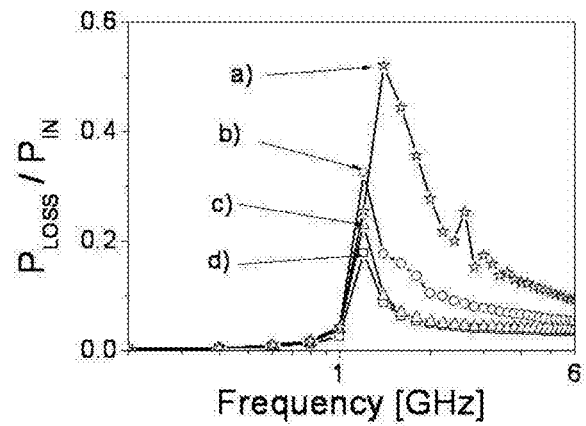
FIG. 12 is a graph showing a variation in absorbing power when real and imaginary parts of complex permeability increase at the same time.

As shown in FIG. 11, absorbing power relative to a variation in the imaginary part of the complex permeability showed a smaller variation than absorbing power relative to a variation in the real part thereof. In FIG. 11, (a) shows a case where permeability ($\mu'$, $\mu''$) is (2,100), (b) shows a case where permeability ($\mu'$, $\mu''$) is (2,40), (c) shows a case where permeability ($\mu'$, $\mu''$) is (2,20), and (d) shows a case where permeability ($\mu'$, $\mu''$) is (2,10). FIG. 12 shows a variation in absorbing power when the real and imaginary parts of the complex permeability are increased at the same time. Since a variation in the real part mostly affects the variation in absorbing power, the absorbing power showed a similar variation to the case of FIG. 10. In FIG. 12, (a) shows a case where permeability ($\mu'$, $\mu''$) is (10,100), (b) shows a case where permeability ($\mu'$, $\mu''$) is (4,40), (c) shows a case where permeability ($\mu'$, $\mu''$) is (2,20), and (d) shows a case where permeability ($\mu'$, $\mu''$) is (1,10).

Figure 13:
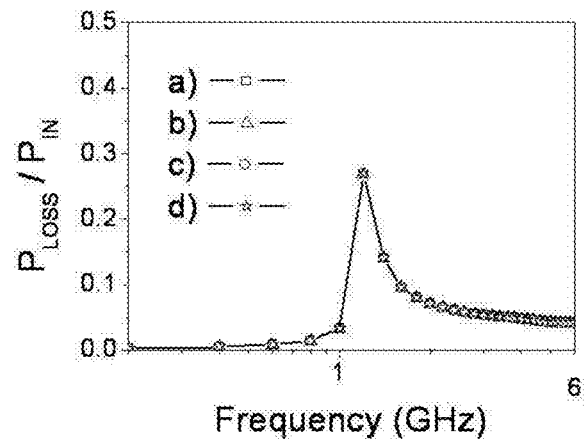
FIG. 13 is a graph showing a variation in absorbing power with an increase in a real part of a complex dielectric constant.
Figure 14:
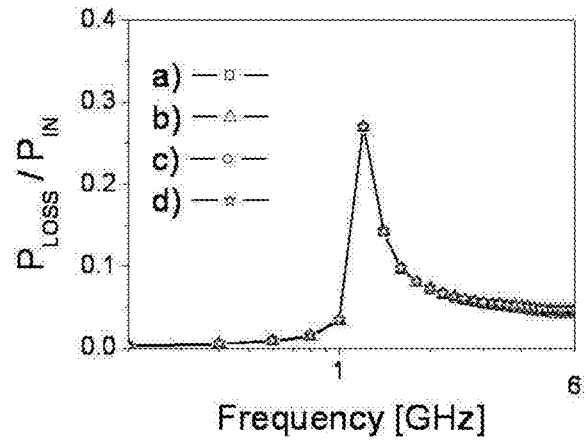
FIG. 14 is a graph showing a variation in absorbing power with an increase in an imaginary part of a complex dielectric constant.

When permeability ($\mu'$, $\mu''$) of an absorber is fixed to (2,20) and a complex dielectric constant ($\in r=\in'-j\in''$) increases, variations in absorbing power are shown in FIGS. 13 and 14. In FIG. 13, (a) shows a case where the dielectric constant ($\in'$, $\in''$) is (1,0), (b) shows a case where the dielectric constant ($\in'$, $\in''$) is (2,0), (c) shows a case where the dielectric constant ($\in'$, $\in''$) is (5,0), and (d) shows a case where the dielectric constant ($\in'$, $\in''$) is (10,0). In FIG. 14, (a) shows a case where the dielectric constant ($\in'$, $\in''$) is (10,0), (b) shows a case where the dielectric constant ($\in'$, $\in''$) is (10,2), (c) shows a case where the dielectric constant ($\in'$, $\in''$) is (10,4), and (d) shows a case where the dielectric constant ($\in'$, $\in''$) is (10,6). It can be seen that absorbing power does not vary due to an increase in dielectric constant.

B) Analysis of Absorbing Power Relative to Size of Magnetic Composite

Figure 15:
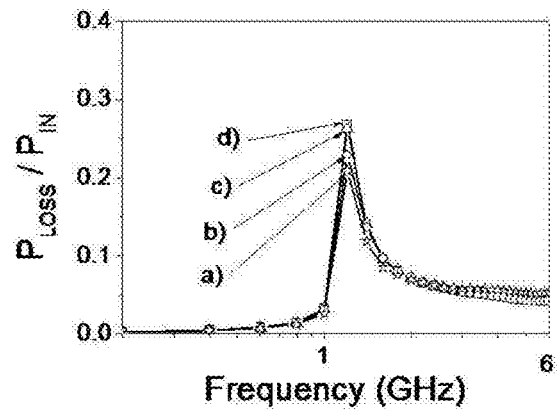
FIG. 15 is a graph showing a variation in absorbing power relative to a variation in the width of a magnetic composite.

Variations in absorbing power relative to the sizes of a magnetic composite were compared. In FIG. 15, when variations in absorbing power relative to the widths of the magnetic composite were compared, although absorbing power increased up to a specific width, the absorbing power did not vary when the width of the magnetic composite exceeded the specific width. This indicates that EMWs supplied from a microstrip signal line are not transmitted through the magnetic composite having the specific width or more. Accordingly, it can be seen that there is an optimum width according to the permeability or electrical conductivity of the magnetic composite. In FIG. 15, (a) shows a case where a magnetic composite has a width of about 4.4 mm, (b) shows a case where a magnetic composite has a width of about 8 mm, (c) shows a case where a magnetic composite has a width of about 15 mm, and (d) shows a case where a magnetic composite has a width of about 48 mm.

Figure 16:
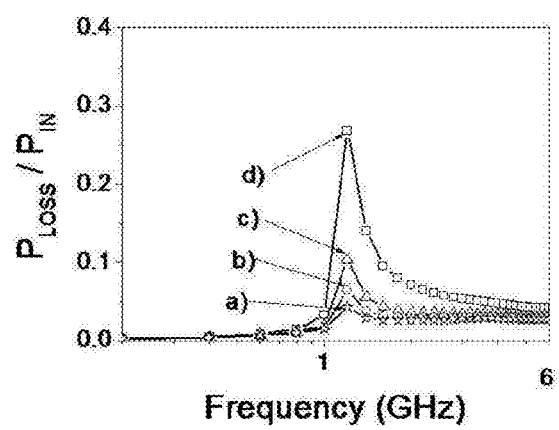
FIG. 16 is a graph showing a variation in absorbing power relative to a variation in the length of a magnetic composite.

FIG. 16 shows a variation in absorbing power relative to a variation in the length of a magnetic composite. It can be seen that as the length of the magnetic composite increases, absorbing power also increases proportionately. In FIG. 16, (a) shows a case where a magnetic composite has a length of about 4.4 mm, (b) shows a case where a magnetic composite has a length of about 8 mm, (c) shows a case where a magnetic composite has a length of about 15 mm, and (d) shows a case where a magnetic composite has a length of about 48 mm.

Figure 17:
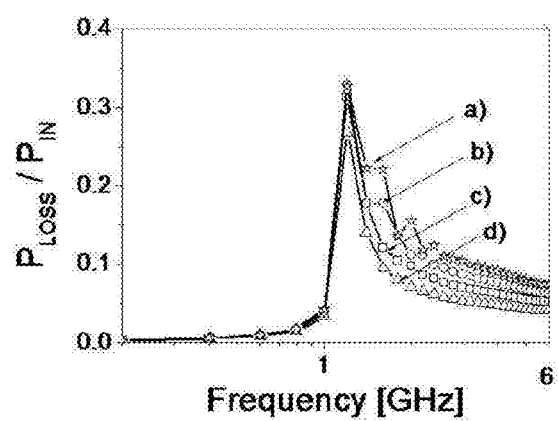
FIG. 17 is a graph showing a variation in absorbing power with an increase in the thickness of a magnetic composite.

A variation in absorbing power with an increase in the thickness of a magnetic composite was shown in FIG. 17. In FIG. 17, (a) shows a case where a magnetic composite has a thickness of about 250 mm, (b) shows a case where a magnetic composite has a thickness of about 200 mm, (c) shows a case where a magnetic composite has a thickness of about 150 mm, and (d) shows a case where a magnetic composite has a thickness of about 100 mm. Although absorbing power increased with an increase in the thickness of the magnetic composite, the absorbing power did not increase any more when the magnetic composite had a specific thickness or more.

C) Analysis of Absorbing Power of Magnetic Composite

Figure 18:
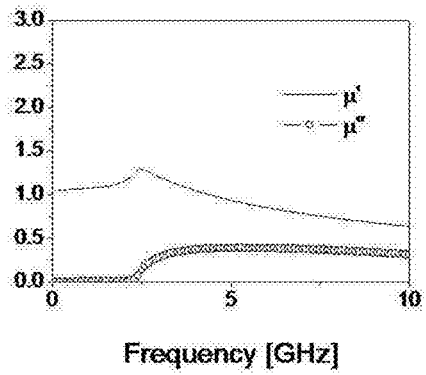
FIGS. 18 through 20 are graphs showing variations in complex permeability relative to the content of magnetic particles in a composite.
Figure 19:
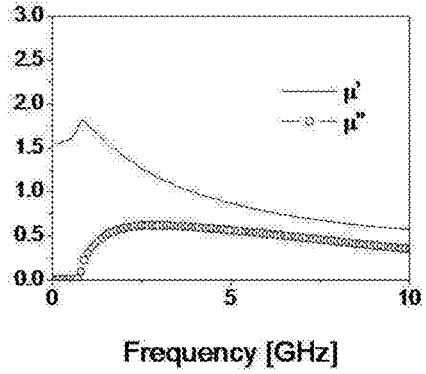
Figure 20:
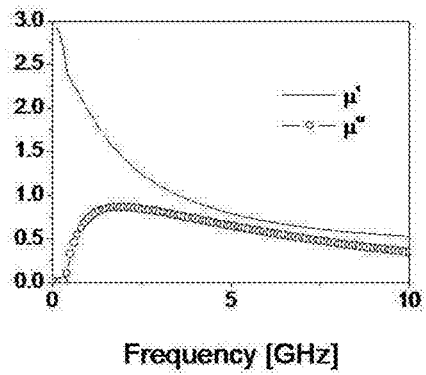

EMW absorbing power of a magnetic composite thin layer manufactured by putting magnetic particles in a non-magnetic resin was analyzed. In general, when a composite is formed using ferromagnetic particles, permeability is reduced, and resonance of permeability relative to frequency disappears. Thus, the absorbing power of the composite is maintained constant at a low frequency and reduced with an increase in frequency. Variations in complex permeability relative to the content of magnetic particles in a magnetic composite are shown in FIGS. 18 through 20. FIG. 18 shows a case where the magnetic particles are contained at a content of about 20% by weight, FIG. 19 shows a case where the magnetic particles are contained at a content of about 30% by weight, and FIG. 20 shows a case where the magnetic particles are contained at a content of about 40% by weight. Nanoscale NiFe-based Permalloy particles having a spherical or rod shape were used as a magnetic body and had a saturated magnetization ranging from about 30 emu/cm$^3$ to 150 emu/cm$^3$. It is assumed that the non-magnetic resin had a permeability of 1.

Figure 21:
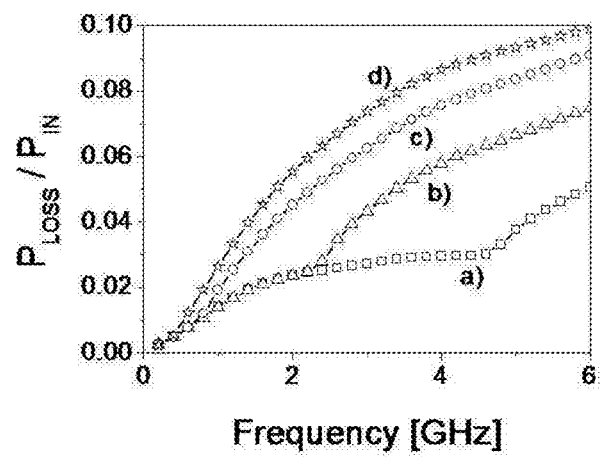
FIG. 21 is a graph showing a variation in absorbing power relative to the content of magnetic particles in a magnetic composite.

Analysis results of absorbing power obtained by applying the given permeability of the magnetic composite are shown in FIG. 21. In FIG. 21, (a) shows a case where the content of magnetic particles is about 10 volume %, (b) shows a case where the content of magnetic particles is about 20 volume %, (c) shows a case where the content of magnetic particles is about 30 volume %, and (d) shows a case where the content of magnetic particles is about 40 volume %. As the content of the magnetic particles increases, permeability increases so that absorbing power also increases. However, since permeability has a small value in the entire frequency region without resonance, an absorbing power of less than 10% is shown. When magnetic particles with a high permeability are contained at a high content and properly aligned, it may be possible to improve absorbing power. However, there is a specific limit for increasing the content of magnetic particles in a composite. Also, since the composite has high permeability at a low frequency, permeability has an opposite characteristic to power loss, which is proportional to frequency, so that improving absorbing power may be precluded.

(3) Analysis of Improvement of EMW Absorbing Power Due to Conductive Grid

When a mesh-type conductive grid is inserted into a magnetic composite, dielectric loss occurs and also, magnetic loss occurs throughout the composite because EMWs are transmitted to the entire composite along the grid, thereby markedly improving absorbing power. To verify the improvement of absorbing power due to the insertion of the conductive grid into the composite, the influence of variables, such as spaces, positions, sizes, and materials of the conductive grid, upon a variation in absorbing power was analyzed.

As shown in FIG. 22, a conductive grid was formed by selecting a copper (Cu) material and had a size (a) of 20 µm×20 µm×40 mm. Copper lines were disposed in the center of a composite having a thickness of about 100 µm, and the distance between a bottom surface of the composite and a bottom surface of the grid was 40 µm. A grid space (b), which corresponds to the distance between the centers of the copper lines, is a 4 mm×4 mm square.

Figure 23:
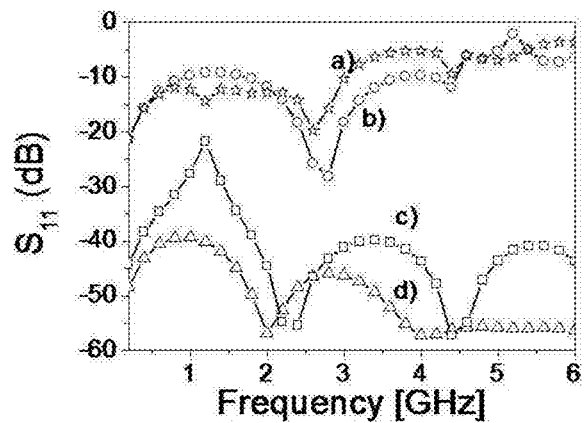
FIG. 23 is a graph showing a variation in reflection coefficient relative to frequency.
Figure 24:
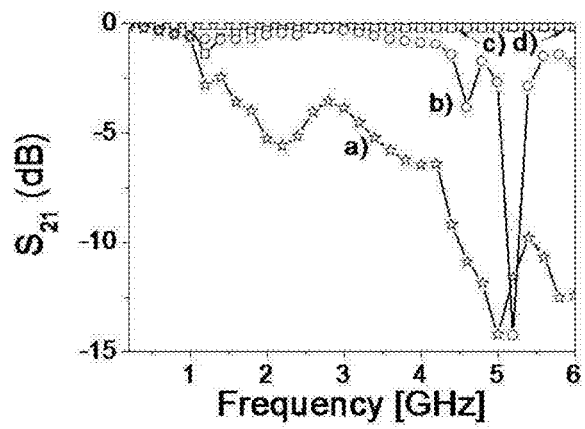
FIG. 24 is a graph showing a variation in transmission coefficient relative to frequency.
Figure 25:
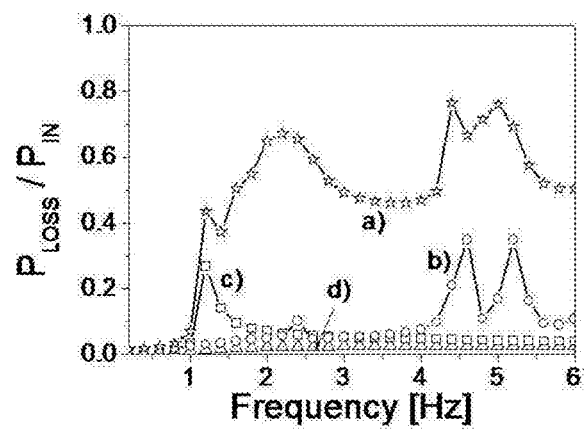
FIG. 25 is a graph showing a variation in absorbing power relative to frequency.

The absorbing power of the grid composite having the above-described basic structure was compared with the absorbing power of a grid used in the air without a magnetic composite (hereinafter, referred to as an 'air-grid') and the absorbing power of a grid-free magnetic composite, and comparison results are shown in FIGS. 23 through 25. In FIGS. 23 through 25, (a) shows the case of the grid composite, (b) shows the case of the air-grid, (c) shows the case of the grid-free magnetic composite, and (d) shows the case of the air. Although the absorbing power of the air-grid is higher than that of the magnetic composite, a difference of less than 10% is made between the absorbing powers of the air-grid and the magnetic composite. The absorbing power of the air-grid reaches a peak at a frequency of about 2.5 GHz, and has a maximum double peak of 35% near a frequency of about 5 GHz. However, the grid composite in which the grid is combined with the magnetic composite has greatly improved absorbing power throughout the frequency region since reaching a ferromagnetic resonant frequency, and exhibits a maximum absorbing power of 80%. Absorbing power varies by adding the absorbing power of the grid to the absorbing power of the magnetic composite, which corresponds to a reference level. However, the absorbing power increases not by a simple sum but nonlinearly.

A) Variation in Absorbing Power Relative to Grid Space

Figure 26:
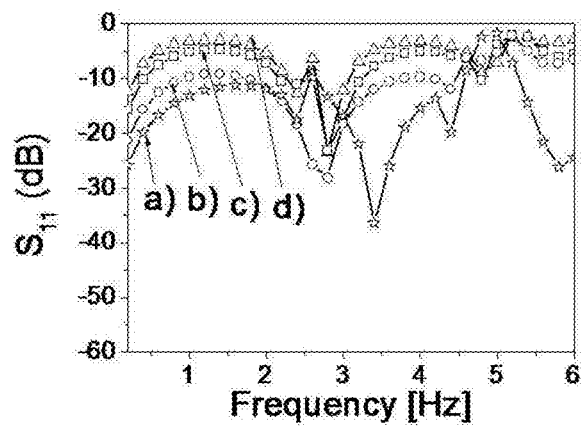
FIG. 26 is a graph showing reflection coefficient relative to an interval of a copper (Cu) air-grid.
Figure 27:
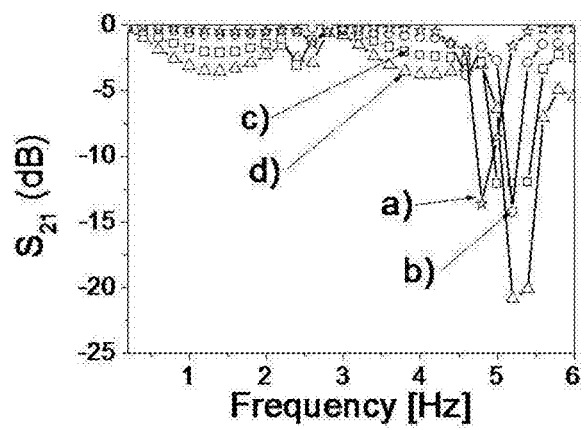
FIG. 27 is a graph showing transmission coefficient relative to an interval of a Cu air-grid.
Figure 28:
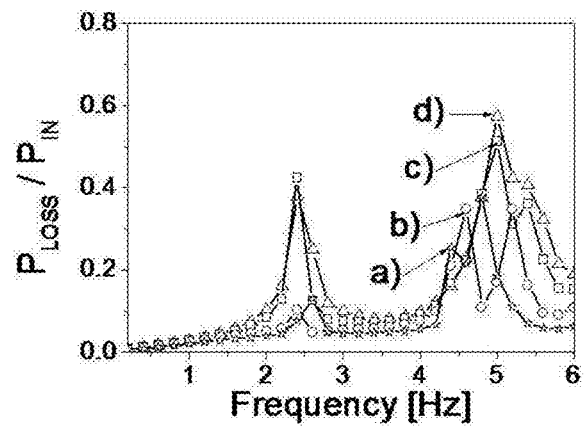
FIG. 28 is a graph showing absorbing power relative to an interval of a Cu air-grid.

Initially, in the case of an air-grid, effects of a grid space upon absorbing power were analyzed by varying the grid space. As shown in FIGS. 26 through 28, resonant absorption occurs at two characteristic frequencies of about 2.5 GHz and about 5 GHz. In FIGS. 26 through 28, (a) shows a case where a grid space is about 7.5 mm×7.5 mm, (b) shows a case where a grid space is about 4 mm×4 mm, (c) shows a case where a grid space is about 2 mm×2 mm, and (d) shows a case where a grid space is about 1 mm×1 mm. In a grid lattice structure, there are two characteristic sizes: a unit lattice size of about 4 mm×4 mm, and a lattice outer size of about 40 mm×40 mm. It is determined that a small lattice size is related with a high frequency, and a large lattice size is related with a low frequency. In the case of an air-grid, as a grid space increases, the maximum absorbing power decreases. When the grid space is about 1 mm, a maximum absorbing power of about 57% is exhibited at a frequency of about 52 GHz.

Figure 29:
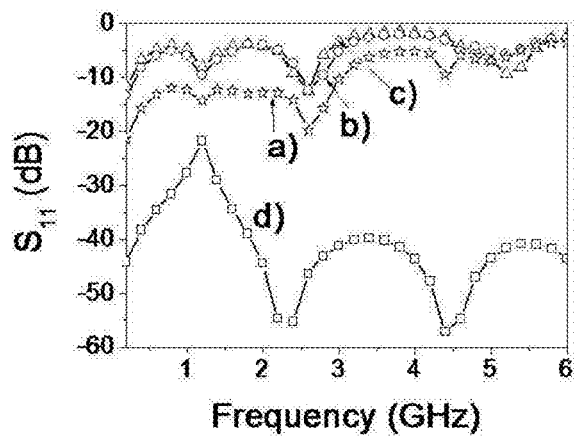
FIG. 29 is a graph showing reflection coefficient relative to a grid space of a Cu grid composite.
Figure 30:
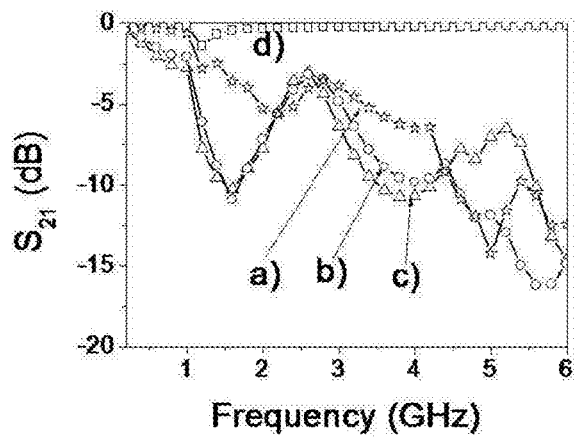
FIG. 30 is a graph showing transmission coefficient relative to a grid space of a Cu grid composite.
Figure 31:
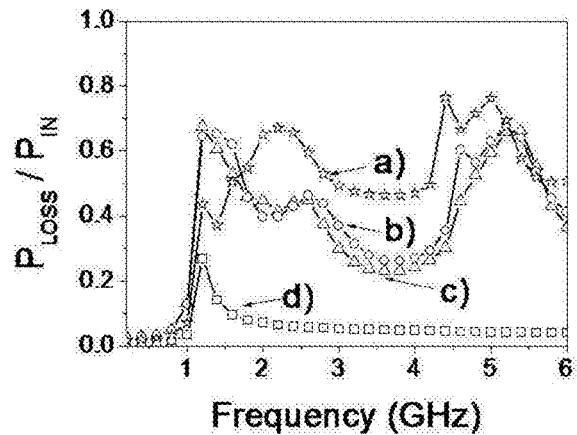
FIG. 31 is a graph showing absorbing power relative to a grid space of a Cu grid composite.

After the grid was inserted into the magnetic composite, a variation in absorbing power was analyzed by varying a grid space. FIGS. 29 through 31 show variations in reflection coefficient, transmission coefficient, and absorbing power when a grid space of the grid composite using a Cu-based grid increased from 1 mm to 4 mm. In FIGS. 29 through 31, (a) shows a case where a grid space is about 4 mm×4 mm, (b) shows a case where a grid space is about 2 mm×2 mm, (c) shows a case where a grid space is about 1 mm×1 mm, and (d) shows a case where there is no grid. It can be seen that as compared with a grid-free magnetic thin layer, the reflection coefficient of the grid composite increases by several tens of dB due to an EMW reflection effect of a conductive grid, and the absorption coefficient of the grid composite is reduced by several dB on the average. The air-grid had maximum absorbing power at a grid space of 1 mm, while the grid composite had a maximum absorbing power of 77% at a grid space of 4 mm. It was confirmed that absorption generally occurred over a wide absorption bandwidth of about 4 GHz or more.

When the microstrip signal line has a linewidth of about 4.4 mm and a grid space is about 4 mm, a grid line disposed 4 mm outwardly from a grid line disposed in the center of the signal line is the closest grid line. An electromagnetic field concentrates in a range of several mm outwardly from a corner disposed 2.2 mm from the center of the signal line. Since a 4-mm grid is disposed 1.8 mm outwardly apart from a corner, the 4-mm grid may be regarded as being within a range where an electromagnetic field concentrates. Accordingly, it can be inferred that EMWs supplied from a transmission line are effectively induced into a magnetic body to facilitate absorption of the EMWs. When a grid space is about 4 mm, distribution of an H-field on a surface of a magnetic thin layer relative to the material and frequency of a grid can be seen from FIG. 59.

Figure 32:
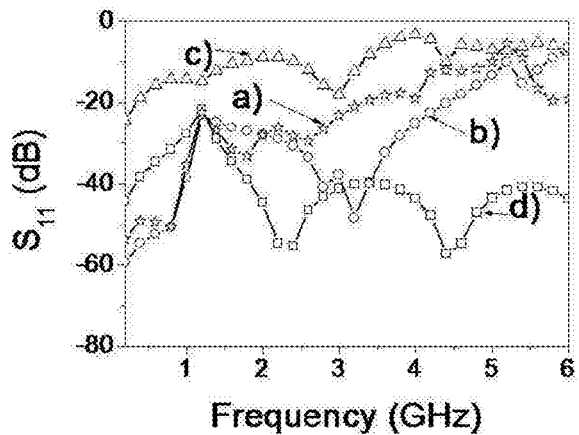
FIG. 32 is a graph showing reflection coefficient relative to a grid space of a Cu grid composite.
Figure 33:
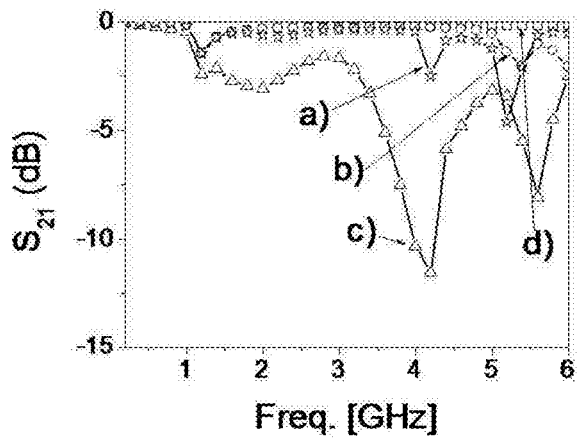
FIG. 33 is a graph showing transmission coefficient relative to a grid space of a Cu grid composite.
Figure 34:
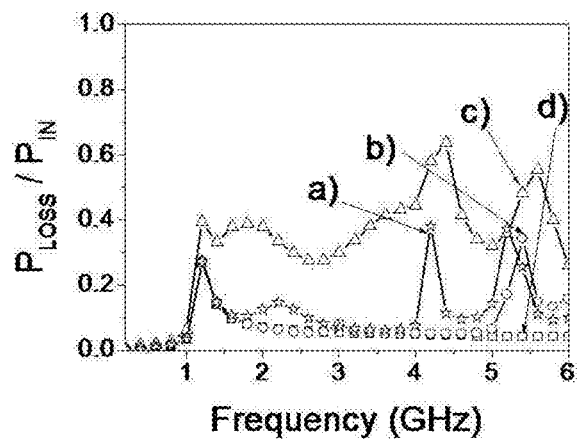
FIG. 34 is a graph showing absorbing power relative to a grid space of a Cu grid composite.

When a grid space is adjusted to 7.5 mm, 15 mm, or 30 mm, there is not a grid forming an outermost edge of a grid. Analysis results of absorbing power relative to a grid space are shown in FIGS. 32 through 34. In FIGS. 32 through 34, (a) shows a case where a grid space is about 30 mm×30 mm, (b) shows a case where a grid space is about 15 mm×15 mm, (c) shows a case where a grid space is about 7.5 mm×7.5 mm, and (d) shows a case where there is no grid. Although a maximum absorbing power of 64% is shown at a grid space of about 7.5 mm, when the grid space exceeds about 7.5 mm, a grid line closest to a signal line is disposed about 13 mm apart from the signal line so that absorbing power sharply drops.

Table 1 shows the maximum, minimum, and average absorbing powers obtained when a grid space was controlled.

TABLE 1

| | Grid space (mm) | Power loss (%) | | | Absorption frequency bandwidth |
|---|---|---|---|---|---|
| | | Pmin | Pmax | Pavg | |
| Grid-free magnetic composite | — | — | 25 | — | ~0.5 GHz |
| Grid composite | 1 | 23 | 66 | 40 | >4 GHz |
| | 2 | 26 | 68 | 43 | |
| | 4 | 46 | 77 | 57 | |
| | 7.5 | 26 | 64 | 39 | |
| | 15 | 5 | 34 | 8 | |
| | 30 | 6 | 37 | 13 | |

Meanwhile, the grid-free magnetic composite has a very narrow absorption frequency bandwidth of about 0.5 GHz, while the grid composite has an absorption frequency bandwidth of 4 GHz or more. The grid composite exhibits a low insertion until reaching 1 GHz, and has high absorbing power throughout the frequency region since reaching 1 GHz. These results reveal that the grid composite operates as a good EMW absorber.

Figure 35:
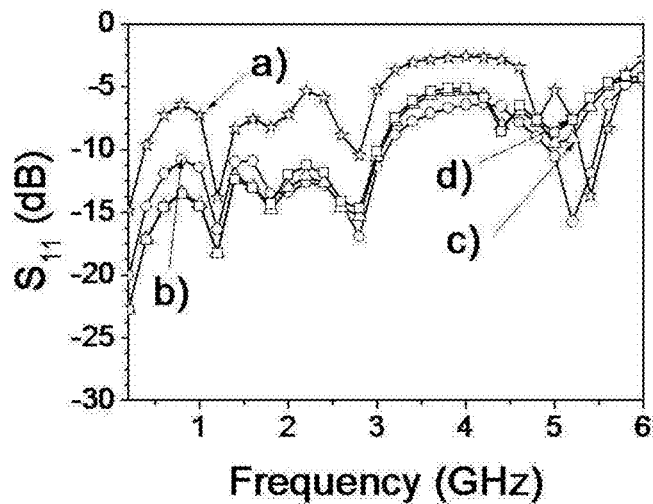
FIG. 35 is a graph showing reflection coefficient relative to a grid space of a Cu grid composite when a signal line of a microstrip line has a width of about 2 mm.
Figure 36:
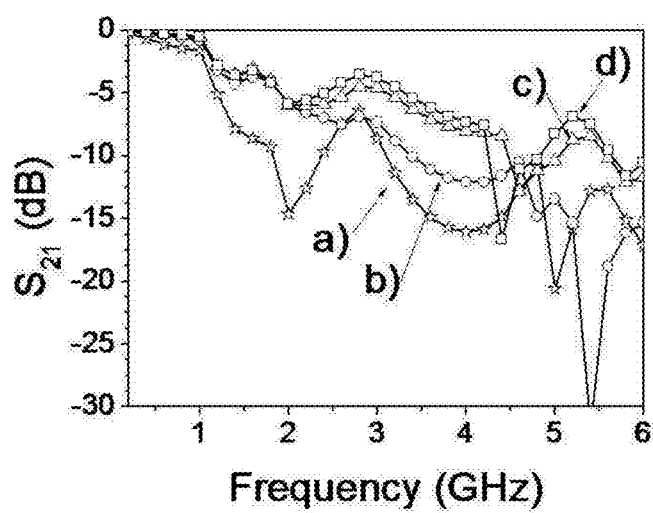
FIG. 36 is a graph showing transmission coefficient relative to a grid space of a Cu grid composite when a signal line of a microstrip line has a width of about 2 mm.
Figure 37:
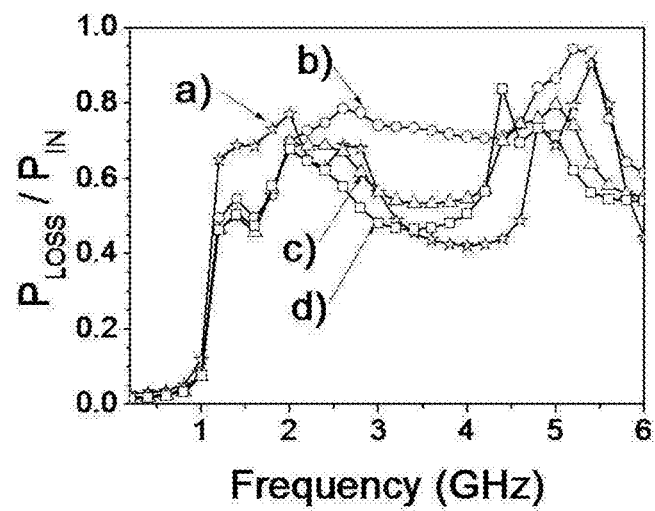
FIG. 37 is a graph showing absorbing power relative to a grid space of a Cu grid composite when a signal line of a microstrip line has a width of about 2 mm.

When the width of the signal line of the microstrip line was changed to 2 mm, a variation in absorbing power relative to a grid space was analyzed. In this case, to enable 50-Ω impedance matching of the microstrip line, the thickness of a dielectric material interposed between the signal line and a ground was changed from 1.6 mm to 0.73 mm. S-parameters and absorbing powers were shown in FIGS. 35 through 37, and the maximum and minimum values thereof are numerically represented in Table 2. In FIGS. 35 through 37, (a) shows a case where a grid space is about 1 mm×1 mm, (b) shows a case where a grid space is about 2 mm×2 mm, (c) shows a case where a grid space is 4 mm×4 mm, and (d) shows a case where a grid space is about 5 mm×5 mm.

Table 2 shows a comparison of absorbing powers relative to grid spaces of the Cu grid composite when the signal line of the microstrip line has a width of about 2 mm.

TABLE 2

| | Grid space (mm) | Power loss (%) | | | Absorption frequency bandwidth |
|---|---|---|---|---|---|
| | | Pmin | Pmax | Pavg | |
| Grid composite | 1 | 42 | 90 | 60 | >4 GHz |
| | 2 | 61 | 94 | 76 | |
| | 3 | 53 | 80 | 63 | |
| | 4 | 46 | 84 | 58 | |

When the signal line has a width of about 2 mm, a corner of the signal line is disposed 1 mm from the center thereof, and a signal line disposed closest to the corner outwardly is disposed 1 mm apart from the corner at a grid space of about 2 mm. Maximum absorbing power is shown at the grid space of about 2 mm and reaches 94%. When a grid space is about 4 mm, a maximum absorbing power of 80% is shown, and absorbing power is generally higher than when the signal line has a width of about 4 mm.

Figure 38:
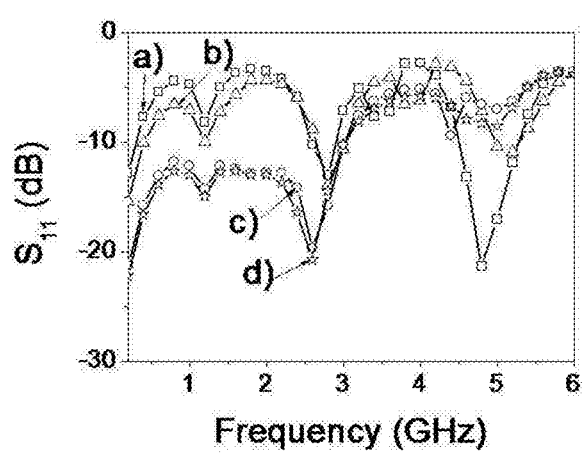
FIG. 38 is a graph showing reflection coefficient with a variation in width when a grid space of a Cu grid composite has a length of about 4 mm.
Figure 39:
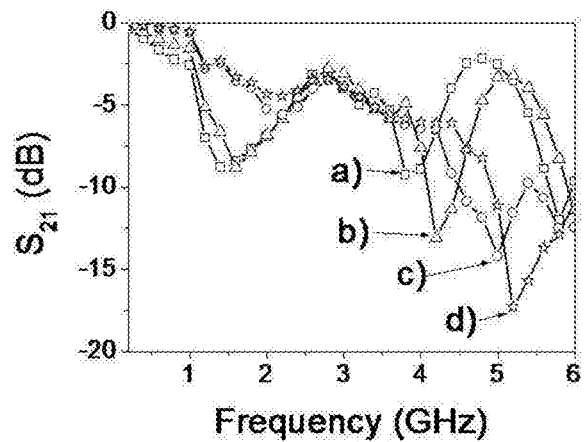
FIG. 39 is a graph showing transmission coefficient with a variation in width when a grid space of a Cu grid composite has a length of about 4 mm.
Figure 40:
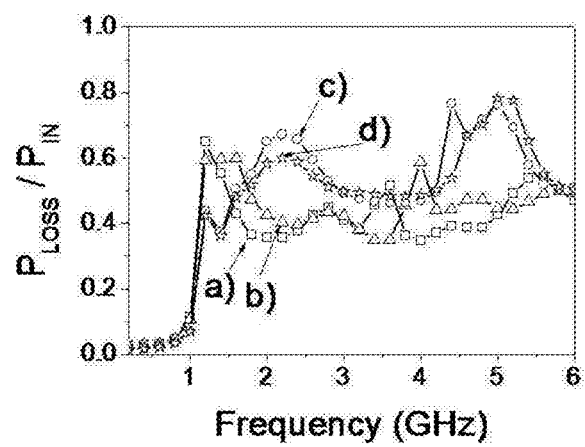
FIG. 40 is a graph showing absorbing power with a variation in width when a grid space of a Cu grid composite has a length of about 4 mm.

Formation of square grid lattices has been explained thus far. A rectangular grid lattice was formed by fixing any one of the width or length of a grid space and varying the other thereof, and the influence of the rectangular grid lattice upon absorbing power was examined. Initially, results obtained when a grid space length was fixed to about 4 mm and a grid space width varied from about 1 mm to about 5 mm are represented in FIGS. 38 through 40 and Table 3. In FIGS. 38 through 40, (a) shows a case where a grid space width is about 1 mm, (b) shows a case where the grid space width is about 2 mm, (c) shows a case where the grid space width is about 4 mm, and (d) shows a case where the grid space width is about 5 mm.

Table 3 shows a comparison of absorbing powers relative to variations in widths when a grid space length of the Cu grid composite is about 4 mm.

TABLE 3

| | width (mm) of grid space | Power loss (%) | | | Absorption frequency bandwidth |
|---|---|---|---|---|---|
| | | Pmin | Pmax | Pavg | |
| Grid-free magnetic composite | — | — | 25 | — | ~0.5 GHz |
| Grid composite | 1 | 35 | 54 | 43 | >4 GHz |
| | 2 | 36 | 57 | 44 | |
| | 3 | 46 | 77 | 58 | |
| | 4 | 48 | 78 | 57 | |

When a grid space width is about 4 mm, a maximum absorbing power of 77% was shown. Thus, the same results were obtained as in a square lattice formed by simultaneously varying the length and width of a grid space. This indicates that the direction of a grid space length does not affect absorbing power.

Figure 41:
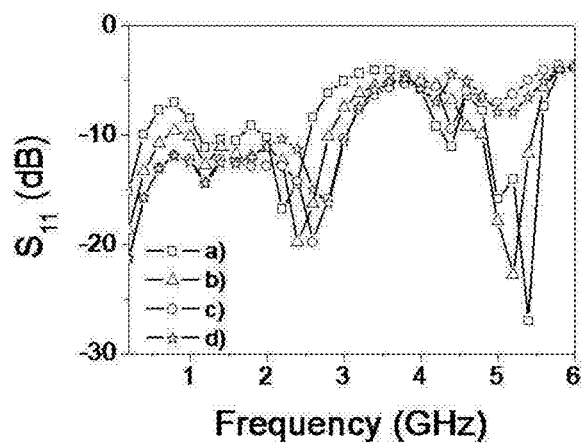
FIG. 41 is a graph showing reflection coefficient with a variation in length when a grid space of a Cu grid composite has a width of about 4 mm.
Figure 42:
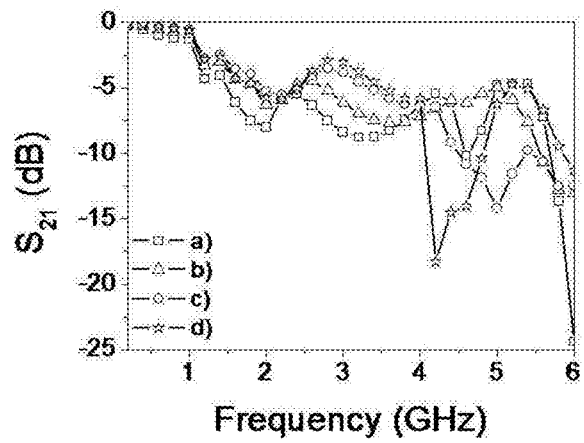
FIG. 42 is a graph showing transmission coefficient with a variation in length when a grid space of a Cu grid composite has a width of about 4 mm.
Figure 43:
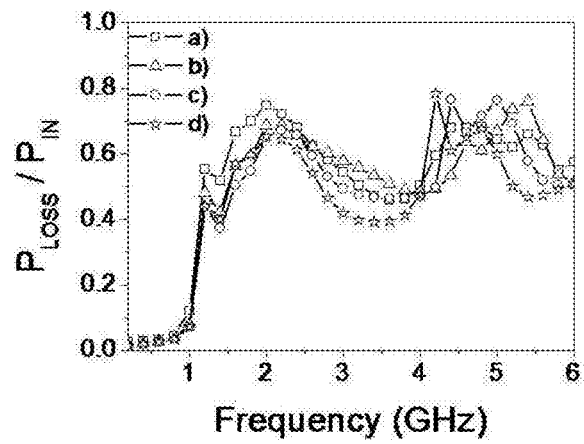
FIG. 43 is a graph showing absorbing power with a variation in length when a grid space of a Cu grid composite has a width of about 4 mm.

Results obtained when a grid space width was fixed to about 4 mm and a grid space length was increased from about 1 mm to about 5 mm are shown in FIGS. 41 through 43 and Table 4. Since the maximum absorbing power varied from 75% to 78%, it can be confirmed again that the grid space length does not greatly affect absorbing power. In FIGS. 41 through 43, (a) shows a case where a grid space length is about 1 mm, (b) shows a case where the grid space length is about 2 mm, (c) shows a case where the grid space length is about 4 mm, and (d) shows a case where the grid space length is about 5 mm.

Table 4 shows a comparison of absorbing powers relative to variations in lengths when a grid space width of a Cu grid composite is about 4 mm.

TABLE 4

| Length (mm) of grid space | Power loss (%) | | | Absorption frequency bandwidth |
|---|---|---|---|---|
| | Pmin | Pmax | Pavg | |
| Grid-free magnetic composite | — | — | 25 | ~0.5 GHz |
| Grid composite | 1 | 46 | 75 | 60 | >4 GHz |
| | 2 | 48 | 76 | 59 | |
| | 3 | 46 | 77 | 57 | |
| | 4 | 39 | 78 | 53 | |

According to the above-described examination, it can be seen that, among a grid line parallel to a signal line and a grid line orthogonal to the signal line, the parallel grid line plays a larger role in inducing EMWs into a magnetic thin layer and absorbing the EMWs. When applied to an actual electronic circuit to remove noise, a grid composite may be manufactured by designing a grid to correspond to disposition of a signal line of the actual circuit, thereby maximizing noise removal effects.

B) Effect of Grid Line Thickness Upon Absorbing Power

Figure 44:
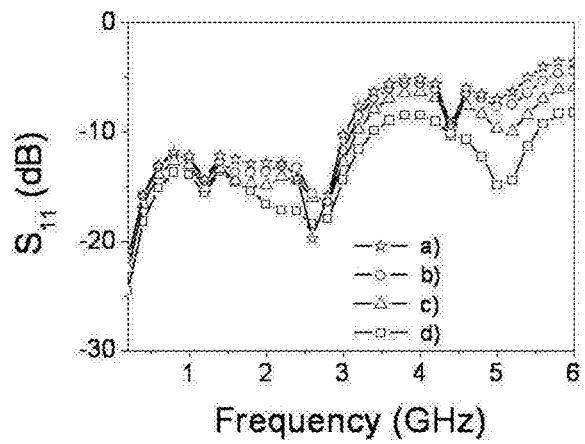
FIG. 44 is a graph showing reflection coefficient relative to a gridline thickness of a Cu grid composite.
Figure 45:
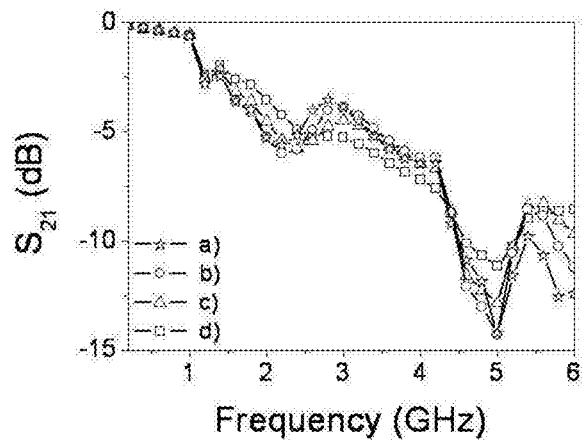
FIG. 45 is a graph showing transmission coefficient relative to a gridline thickness of a Cu grid composite.
Figure 46:
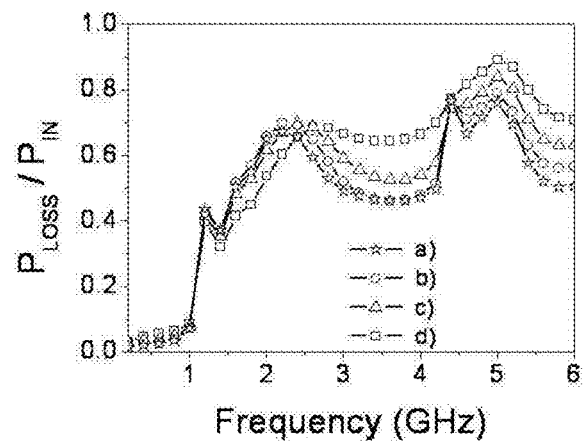
FIG. 46 is a graph showing absorbing power relative to a gridline thickness of a Cu grid composite.

By controlling the thickness of the grid line, the influences of a thin grid line and a thick grid line upon absorbing power were analyzed. When a thick grid line is used, resistance is reduced so that an induced current can be effectively formed. However, since a conductive grid line is used, skin depth may be reduced according to the material of the grid line in the case of high-frequency waves, and it is expected that a grid line having a thickness equal to or more than the skin depth is ineffective. When the thickness of a Cu grid line increased from about 3 μm to about 20 μm, effects of the thickness of the Cu grid line upon absorbing power were analyzed and represented in FIGS. 44 through 46 and Table 5. In FIGS. 44 through 46, (a) shows a case where a grid thickness is about 20 μm×20 μm, (b) shows a case where the grid thickness is about 10 μm×10 μm, (c) shows a case where the grid thickness is about 5 μm×5 μm, and (d) shows a case where the grid thickness is about 3 μm×3 μm.

Table 5 shows a comparison of absorbing powers relative to grid thicknesses of a Cu grid composite.

TABLE 5

| Grid thickness (μm × μm) | Power loss (%) | | | Absorption frequency bandwidth |
|---|---|---|---|---|
| | Pmin | Pmax | Pavg | |
| Grid-free magnetic composite | — | — | 25 | — | ~0.5 GHz |
| Grid composite | 3 × 3 | 60 | 89 | 71 | >4 GHz |
| | 5 × 5 | 52 | 84 | 65 | |
| | 10 × 10 | 45 | 79 | 61 | |
| | 20 × 20 | 46 | 77 | 58 | |

When the grid thickness is about 3 μm, a maximum absorbing power of 89% is exhibited. When the grid thickness exceeds about 3μ, absorbing power gradually decreases. When the grid thickness is about 3 μm at a frequency lower than about 2.5 GHz, a lower absorbing power was lower than when a thick grid line was used. Thus, it can be confirmed that an optimum grid thickness depends on frequency.

B) Effect of Grid Position Upon Absorbing Power

Figure 47:
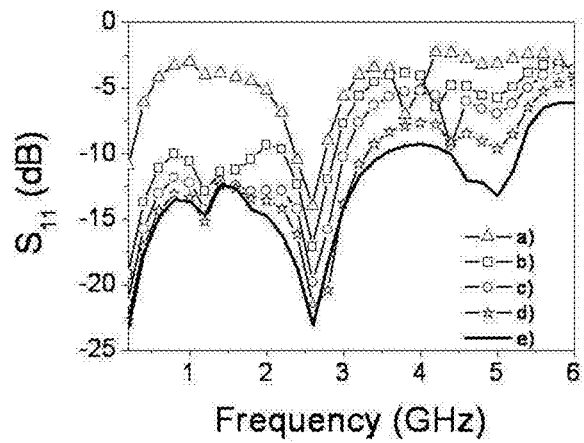
FIG. 47 is a graph showing reflection coefficient relative to a grid position (height) of a Cu grid composite.
Figure 48:
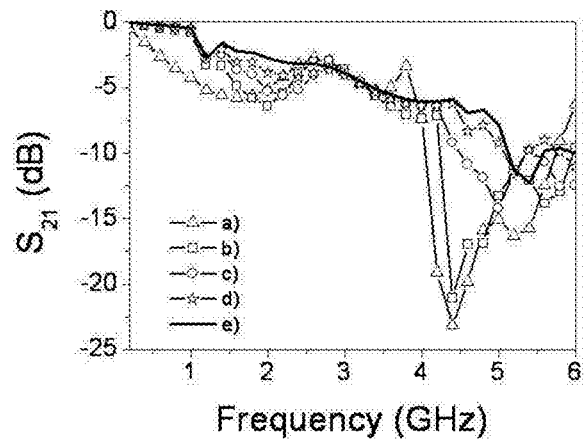
FIG. 48 is a graph showing transmission coefficient relative to a grid position (height) of a Cu grid composite.
Figure 49:
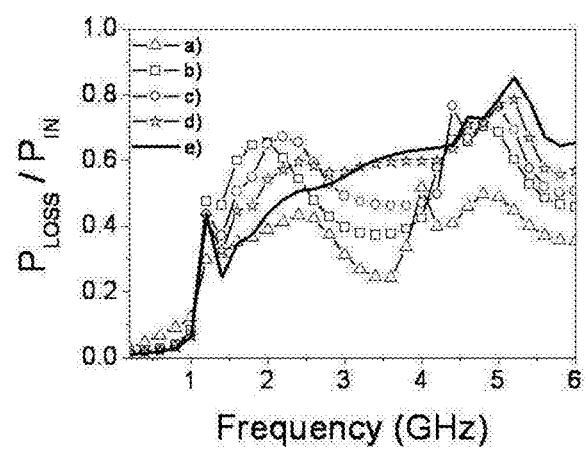
FIG. 49 is a graph showing absorbing power relative to a grid position (height) of a Cu grid composite.

Since the intensity of EMWs propagated from a microstrip signal line weakens as the EMWs become far away from the signal line, the distance between an absorber and the signal line may be a significant variable. Similarly, it is expected that the position of a grid in a magnetic thin layer greatly affects absorbing power. When the distance between a bottom surface of the magnetic thin layer and a bottom surface of the grid was defined as a grid position (height), and the height was increased from about 0 μm to about 80 μm, effects of the height upon absorbing power was analyzed and the analysis results are graphically represented in FIGS. 47 through 49 and numerically represented in Table 6. In FIGS. 47 through 49, (a) shows a case where the grid position (height) is about 0 μm, (b) shows a case where the grid position (height) is about 20 μm, (c) shows a case where the grid position (height) is about 40 μm, (d) shows a case where the grid position (height) is about 60 μm, and (e) shows a case where the grid position (height) is about 80 μm.

Table 6 shows a comparison of absorbing powers relative to a grid position (height) of a Cu grid composite.

TABLE 6

| Grid thickness (μm) | Power loss (%) | | | Absorption frequency bandwidth |
|---|---|---|---|---|
| | Pmin | Pmax | Pavg | |
| Grid-free magnetic composite | — | — | 25 | — | ~0.5 GHz |
| Grid composite | 0 | 24 | 52 | 39 | >4 GHz |
| | 20 | 37 | 70 | 52 | |
| | 40 | 46 | 77 | 58 | |
| | 60 | 54 | 79 | 62 | |
| | 80 | 44 | 85 | 63 | |

When the grid is disposed at the top surface of the magnetic thin layer, maximum absorbing power is shown. Thus, it can be inferred that as the distance between the grid and the signal line increases, absorbing power is affected by reflection due to the grid more than a reduction in the intensity of EMWs. When the grid is disposed at the bottom surface of the magnetic thin layer, reflection greatly occurs during an initial period to greatly reduce EMWs induced into a magnetic body, thereby lowering absorbing power.

D) Effect of Grid Size Upon Absorbing Power

Figure 50:
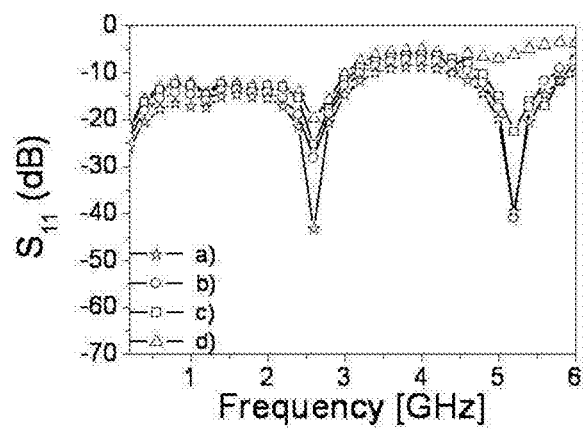
FIG. 50 is a graph showing reflection coefficient relative to a size (width) of a Cu grid composite.
Figure 51:
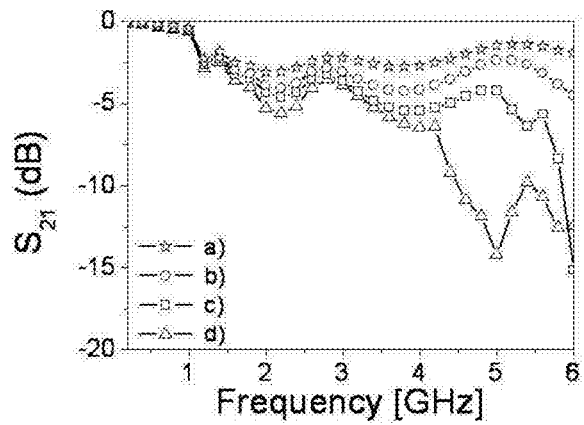
FIG. 51 is a graph showing transmission coefficient relative to a size (width) of a Cu grid composite.
Figure 52:
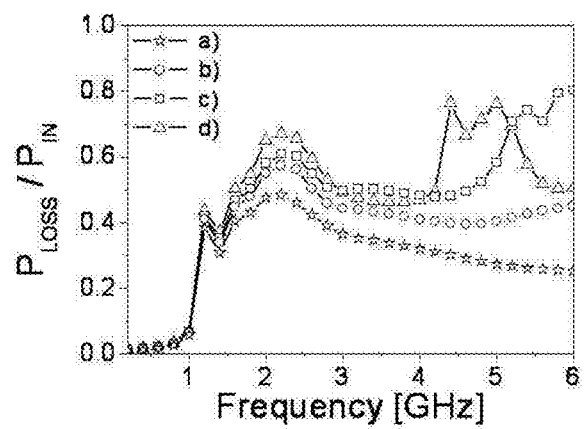
FIG. 52 is a graph showing absorbing power relative to a size (width) of a Cu grid composite.

The influence of not the size of a unit grid (i.e., grid space) but the size of the entire grid upon absorbing power was analyzed. Among the sizes of the grid, when the grid length was fixed and the grid width was reduced from about 40 mm to about 16 mm, analysis results of absorbing powers are shown in FIGS. 50 through 52. In FIGS. 50 through 52, (a) shows a case where a grid size (width) is about 40 mm×16 mm, (b) shows a case where the grid size (width) is about 40 mm×24 mm, (c) shows a case where the grid size (width) is about 40 mm×32 mm, and (d) shows a case where the grid size (width) is about 40 mm×40 mm.

When a grid width is reduced with the size of the magnetic composite fixed, an induced current is not generated due to the grid in a magnetic thin layer disposed outside the grid width, thereby lowering absorbing power. Thus, when a grid width was about 16 mm, a maximum absorbing power of 50% was shown near a frequency of about 2 GHz. Meanwhile, when the outside of the grid has a smaller size, resonance should occur at a higher frequency. When the grid size was about 32 mm, a peak occurred at a frequency of about 6 GHz, and when the grid size was about 24 mm or 16 mm, the second peak was not shown at two characteristic frequencies of the grid within the examined range. When it becomes possible to estimate higher frequencies afterwards, the second peak may be confirmed. Presently, it may be advantageous to fill the entire magnetic composite with the grid.

E) Effect of Grid Material Upon Absorbing Power (Conductivity, Permeability)

Figure 53:
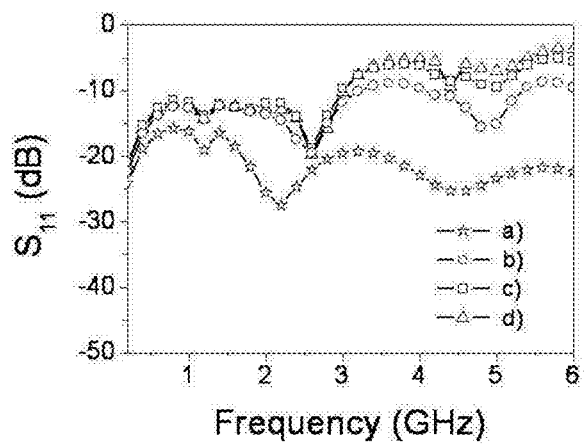
FIG. 53 is a graph showing reflection coefficient relative to grid electrical conductivity of a grid composite.
Figure 54:
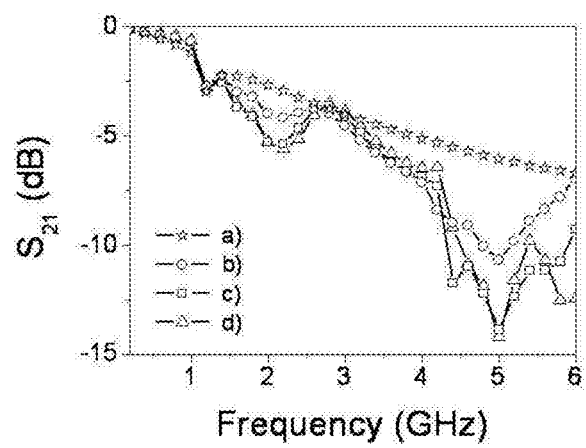
FIG. 54 is a graph showing transmission coefficient relative to grid electrical conductivity of a grid composite.
Figure 55:
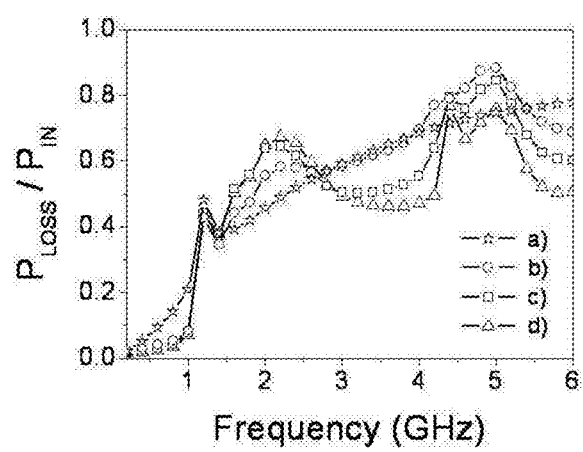
FIG. 55 is a graph showing absorbing power relative to grid electrical conductivity of a grid composite.

As mentioned in the analysis of the effect of the grid thickness, since the electrical conductivity of the grid directly affects formation of an induced current, the electrical conductivity of the grid greatly affects absorbing power. Effects of the electrical conductivity of the grid upon absorbing power were analyzed while reducing the electrical conductivity of the grid from $6\times10^7$ simens/m, which is the electrical conductivity of Cu, to $6\times10^4$ simens/m, and graphically and numerically represented in FIGS. 53 through 55 and Table 7, respectively. In FIGS. 53 through 55, (a) shows a case where a grid conductivity is about $6\times10^4$ simens/m, (b) shows a case where the grid conductivity is about $6\times10^5$ simens/m, (c) shows a case where the grid conductivity is about $6\times10^6$ simens/m, and (d) shows a case where the grid conductivity is $6\times10^7$ simens/m.

Table 7 shows a comparison of absorbing powers relative to grid electrical conductivities of a Cu grid composite.

TABLE 7

| Grid electrical conductivity | Power loss (%) | | | Absorption frequency |
|---|---|---|---|---|
| (simens/m) | Pmin | Pmax | Pavg | bandwidth |
| Grid-free magnetic composite | — | — | 25 | — ~0.5 GHz |
| Grid composite | $6 \times 10^7$ | 46 | 77 | 58 >4 GHz |
| | $6 \times 10^6$ | 50 | 85 | 63 |
| | $6 \times 10^5$ | 56 | 88 | 69 |
| | $6 \times 10^4$ | 46 | 78 | 66 |

As electrical conductivity decreases, a reflection coefficient decreases, whereas a transmission coefficient does not greatly vary. In conclusion, it can be seen that absorbing power increases with a reduction in electrical conductivity. As in the analysis of the grid position, it can be seen that reflection due to the grid produces important effects. A reduction in electrical conductivity leads to other phenomena where a resonant peak disappears, and the transmission coefficient decreases and absorbing power increases in nearly linear shapes with an increase in frequency. It can be indirectly confirmed again that the presence of two characteristic resonant frequencies due to the grid is related with a circular loop in which an induced current is formed. According to examinations, it should be noted that selection of a material having a specific electrical conductivity is affected by complicated factors.

Figure 56:
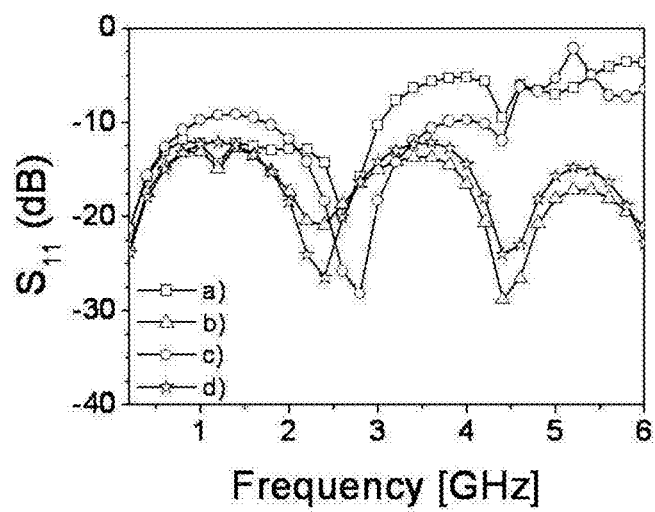
FIG. 56 is a graph showing reflection coefficient relative to a material (copper (Cu) and nickel (Ni)) of a grid.
Figure 57:
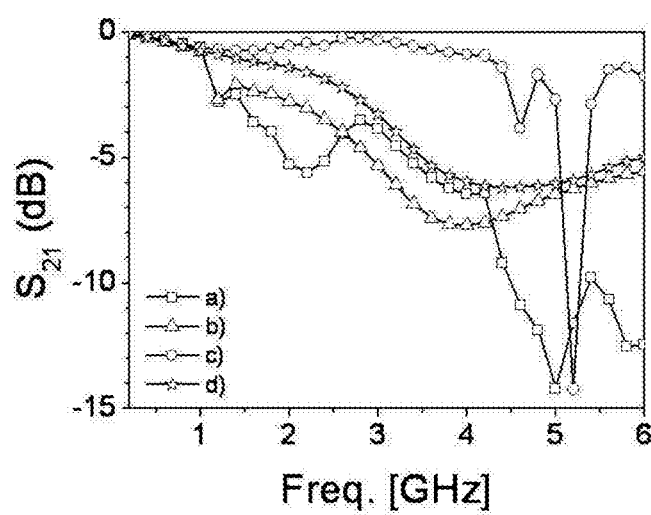
FIG. 57 is a graph showing transmission coefficient relative to a material (Cu and Ni) of a grid.
Figure 58:
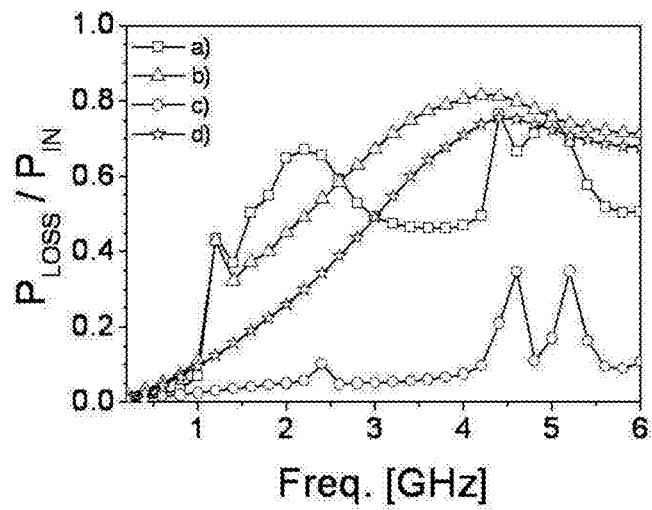
FIG. 58 is a graph showing absorbing power relative to a material (Cu and Ni) of a grid.

To analyze effects of magnetic properties of a grid, a grid was prepared using Ni having a high relative permeability of 600 and an electrical conductivity of about $1.5\times10^7$ simens/m, which is ¼ the electrical conductivity of Cu, and the absorbing power of the Ni grid was analyzed and compared with that of the Cu grid. Cu has a relative permeability less than 1, which is only a small difference, and has a diamagnetic property, while Ni has a ferromagnetic property. In FIGS. 56 through 58, the absorbing power of a Ni grid was compared with that of a Cu grid. In FIGS. 56 through 58, (a) shows a case where a magnetic composite and a Cu grid are used, (b) shows a case where the magnetic composite and a Ni grid are used, (c) shows a case where a Cu grid in the air (Cu air-grid) is used without the magnetic composite, and (d) shows a case where a Ni grid in the air (Ni air-grid) is used without the magnetic composite.

In the above-described analysis of the effects of electrical conductivity, the Ni grid should exhibit two characteristic peaks in consideration of the Ni electrical conductivity of about $1.5\times10^7$ simens/m, the transmission coefficient and absorbing of the Ni grid reached peaks near a frequency of about 4 GHz, were gradually changed over frequency, and did not show narrow peaks. The Ni grid already exhibited an absorbing power of about 75% in an air-grid state and had an about 10 to 20% improved absorbing power due to a magnetic body in a magnetic composite. This fact may be due to a high permeability of Ni.

Figure 59:
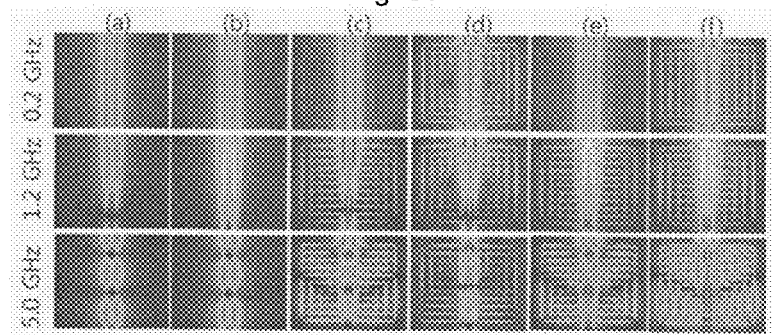
FIG. 59 is a diagram showing the intensity of an H-field on a surface of a magnetic thin layer relative to a material (Cu and Ni) and frequency of a grid.

FIG. 59 shows the intensity of an H-field on a top surface of a magnetic composite relative to the material and frequency of a grid. In the case of the Ni grid, an H-field is not distributed along a grid lattice at a frequency of about 0.2 GHz unlike the Cu grid. In contrast, at a frequency of about 5 GHz, when the Ni air-grid is used or when the Ni grid is inserted into the magnetic composite, a strong H-field is equally distributed along the grid lattice. This indicates that the Ni grid shows a resonance phenomenon on its own at the frequency of about 5 GHz. It can be inferred that a slightly stronger H-field is distributed at a frequency of about 4 GHz based on the results of absorbing power. Since a frequency of about 1.2 GHz is near the magnetic resonant frequency, Ni and Cu exhibit similar intensities of H-field. At a frequency of about 5 GHz, the Cu grid has a weak H-field in an air-grid state, and has a strong H-field when inserted into the magnetic substance. It can be concluded that a dielectric effect due to the Cu grid is most compatible with a magnetic effect due to the magnetic substance at the frequency of about 5 GHz.

F) Effect of Thickness of Grid Composite Upon Absorbing Power

Figure 60:
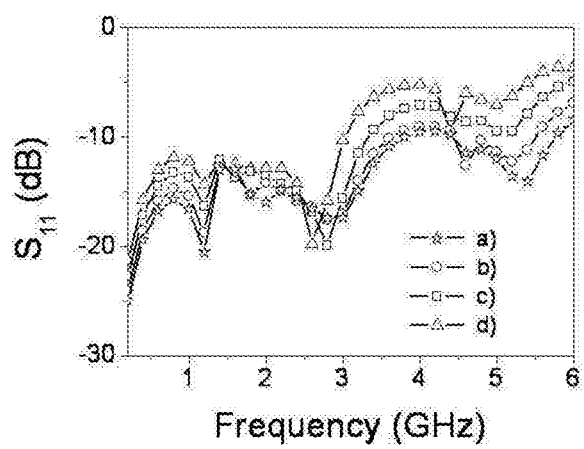
FIG. 60 is a graph showing reflection coefficient relative to a thickness of a Cu grid composite.
Figure 61:
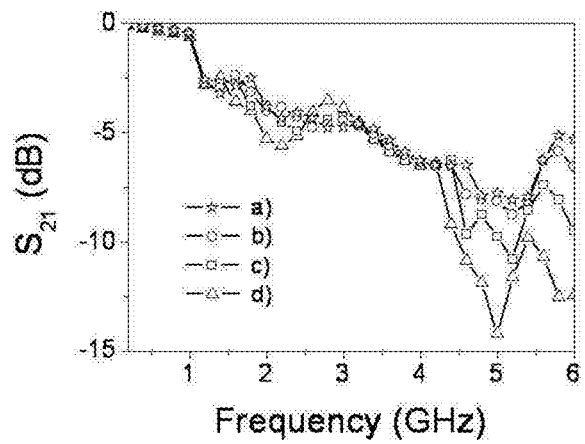
FIG. 61 is a graph showing transmission coefficient relative to a thickness of a Cu grid composite.
Figure 62:
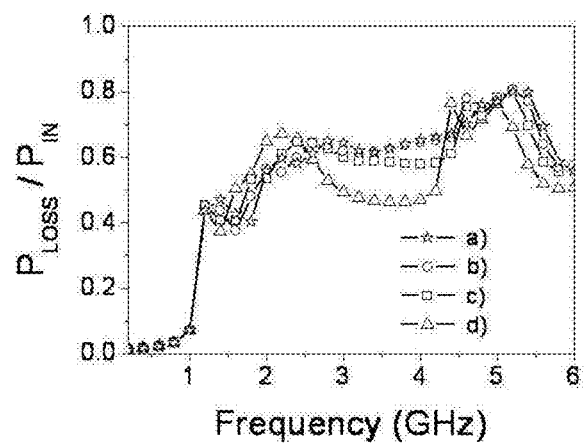
FIG. 62 is a graph showing absorbing power relative to a thickness of a Cu grid composite.

Effects of the thickness of a grid composite including a magnetic composite and a grid upon absorbing power was analyzed and represented in FIGS. 60 through 62 and Table 8. In FIGS. 60 through 62, (a) shows a case where the thickness of the grid composite is about 250 μm, (b) shows a case where the thickness of the grid composite is about 200 μm, (c) shows a case where the thickness of the grid composite is about 150 µm, and (d) shows a case where the thickness of the grid composite is about 100 µm.

Results of a comparison of absorbing powers relative to the thicknesses of a Cu grid composite are shown in Table 8.

TABLE 8

| | Thickness (µm) of grid composite | Power loss (%) | | | Absorption frequency bandwidth |
|---|---|---|---|---|---|
| | | Pmin | Pmax | Pavg | |
| Grid-free magnetic composite | 100 | — | 25 | — | ~0.5 GHz |
| Grid composite | 100 | 46 | 77 | 58 | >4 GHz |
| | 150 | 53 | 80 | 63 | |
| | 200 | 55 | 80 | 65 | |
| | 250 | 55 | 80 | 66 | |

It was seen that as the thickness of the magnetic composite increased, absorbing power increased in a frequency region higher than a resonant frequency. In general, since there is a critical thickness, when the magnetic composite has the critical thickness or more, the influence of the thickness of the magnetic composite upon absorbing power is immaterial. Similarly, as the thickness of the grid composite increases, absorbing power also increases. However, absorbing power is already saturated when the grid composite has a thickness of about 150 µm. Since the effects of the grid are dominant, the thickness of the magnetic body does not have a great influence on absorbing power.

Figure 63:
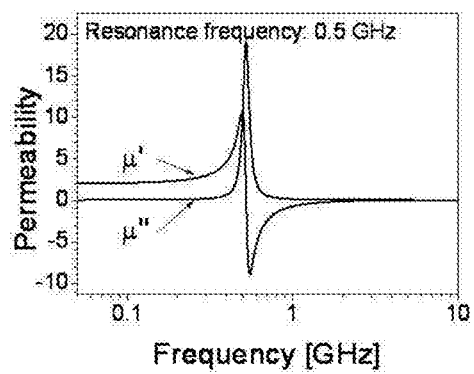
FIG. 63 is a graph showing a variation in permeability relative to a variation in frequency when a resonant frequency is about 0.5 GHz.
Figure 64:
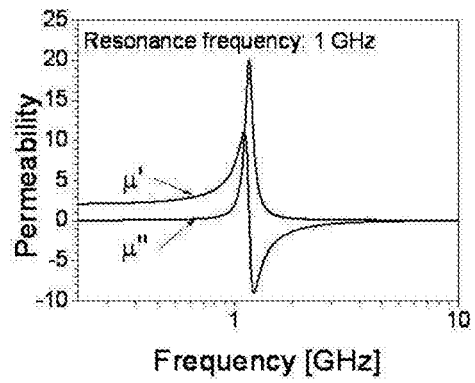
FIG. 64 is a graph showing a variation in permeability relative to a variation in frequency when a resonant frequency is about 1 GHz.
Figure 65:
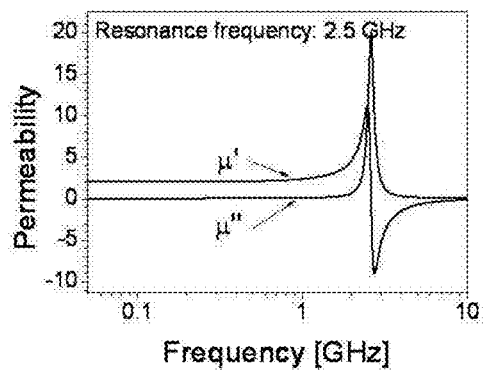
FIG. 65 is a graph showing a variation in permeability relative to a variation in frequency when a resonant frequency is about 2.5 GHz.
Figure 66:
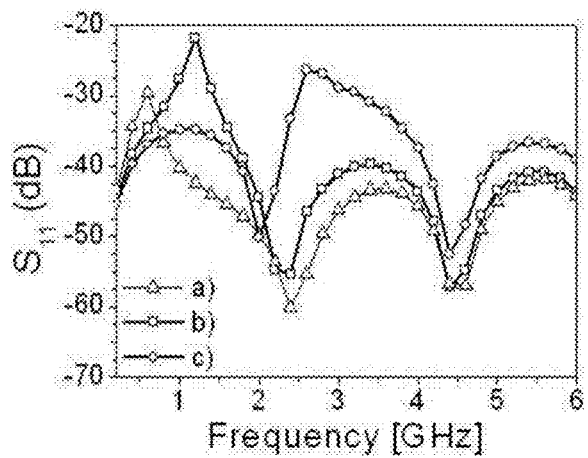
FIG. 66 is a graph showing reflection coefficient relative to a variation in resonant frequency of a magnetic thin layer.
Figure 67:
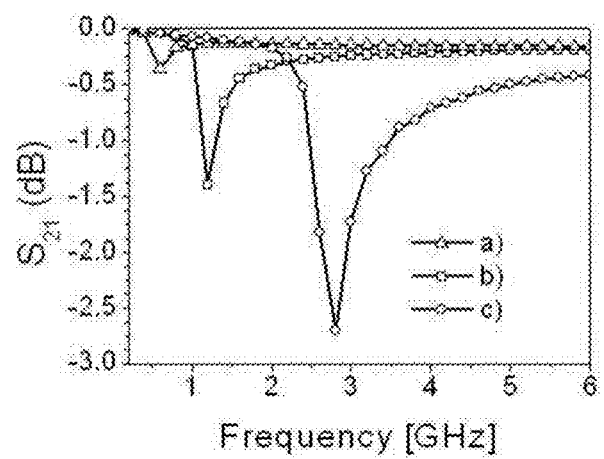
FIG. 67 is a graph showing transmission coefficient relative to a variation in resonant frequency of a magnetic thin layer.
Figure 68:
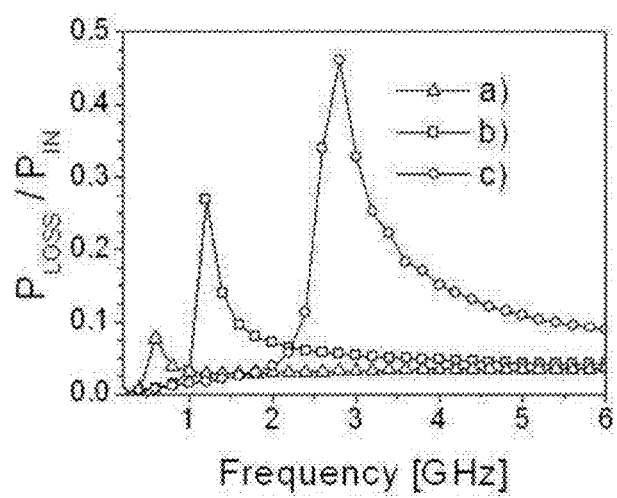
FIG. 68 is a graph showing absorbing power relative to a variation in resonant frequency of a magnetic thin layer.

G) Effects of Resonant Frequency of Grid-Inserted Magnetic Composite and Content of Magnetic Particles in Composite Upon Absorbing Power To analyze the influence of a magnetic resonant frequency upon absorbing power, absorbing powers obtained when a magnetic composite has the same permeability and different resonant frequencies of about 0.5 GHz, 1 GHz, and 2.5 GHz, were analyzed as shown in FIGS. 63 through 65, and analysis results are shown in FIGS. 66 through 68. FIG. 63 is a graph showing a variation in permeability relative to a variation in frequency when a resonant frequency is about 0.5 GHz. FIG. 64 is a graph showing a variation in permeability relative to a variation in frequency when a resonant frequency is about 1 GHz. FIG. 65 is a graph showing a variation in permeability relative to a variation in frequency when a resonant frequency is about 2.5 GHz. In FIGS. 66 through 68, (a) shows a case where a resonant frequency is about 0.5 GHz, (b) shows a case where the resonant frequency is about 1 GHz, and (c) shows a case where the resonant frequency is about 2.5 GHz.

As the resonant frequency increases, a frequency at which strong absorption occurs also increases. Since absorbing power is proportional to frequency, even if the magnetic composite has the same permeability, the magnetic composite exhibits higher absorbing power at a higher frequency. An absorber having a wide absorption bandwidth may be manufactured by mixing magnetic composites having different resonant oscillation frequencies.

Figure 69:
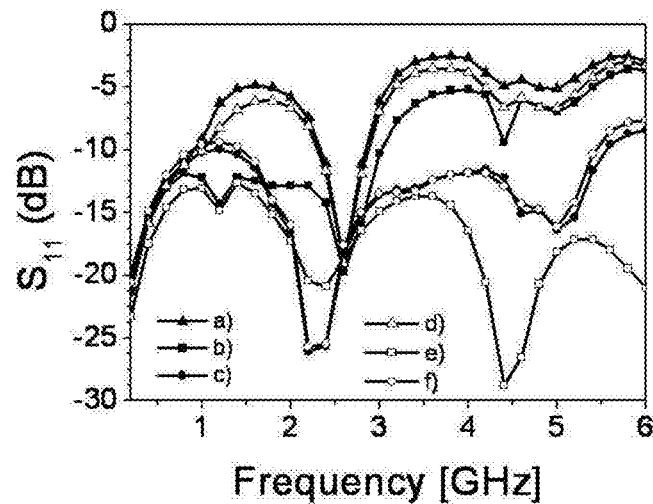
FIG. 69 is a graph showing reflection coefficient relative to a variation in resonant frequency of Cu and Ni grid composites.
Figure 70:
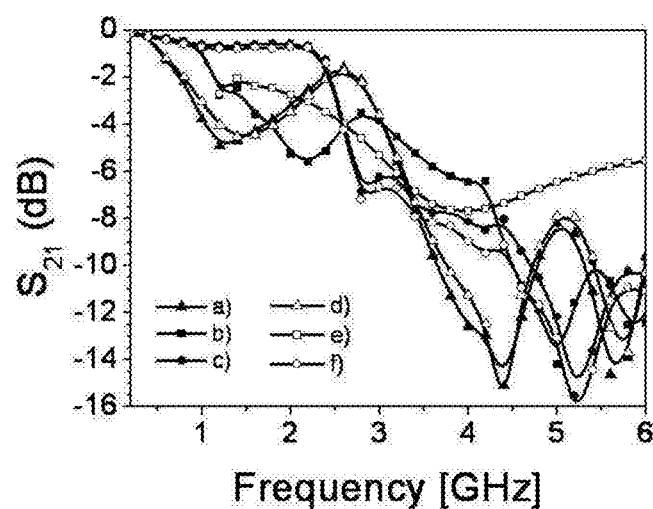
FIG. 70 is a graph showing transmission coefficient relative to a variation in resonant frequency of Cu and Ni grid composite.
Figure 71:
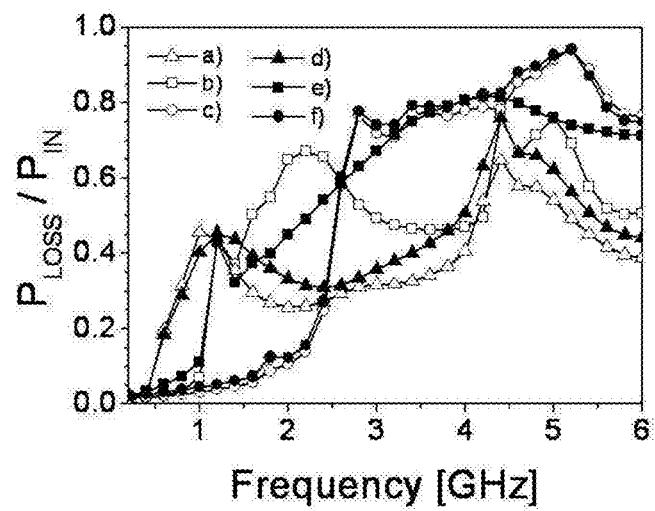
FIG. 71 is a graph showing absorbing power relative to a variation in resonant frequency of Cu and Ni grid composites.

When a grid was applied to magnetic composites having different resonant frequencies, variations in absorbing power are shown in FIGS. 69 through 71. In FIGS. 69 through 71, (a) shows a case where the magnetic composite has a resonant frequency of about 0.5 GHz and includes a Cu grid, (b) shows a case where the magnetic composite has a resonant frequency of about 1 GHz and includes a Cu grid, (c) shows a case where the magnetic composite has a resonant frequency of about 2.5 GHz and includes a Cu grid, (d) shows a case where the magnetic composite has a resonant frequency of about 0.5 GHz and includes a Ni grid, (e) shows a case where the magnetic composite has a resonant frequency of about 1 GHz and includes a Ni grid, and (f) shows a case where the magnetic composite has a resonant frequency of about 2.5 GHz and includes a Ni grid. Similarly to the above-described examination, the magnetic composite has low absorbing power at a frequency lower than the magnetic resonant frequency and has high absorbing power over a wide frequency range due to the grid since reaching the resonant frequency. When the magnetic resonant frequency is high, since absorbing power due to the magnetic composite increases in proportion to frequency, absorbing power increases due to the grid more than the absorbing power due to the magnetic composite. Therefore, the magnetic composite having a high resonant frequency to which the grid is applied has higher absorbing power than when the grid is applied to the magnetic composite having a low resonant frequency.

Figure 72:
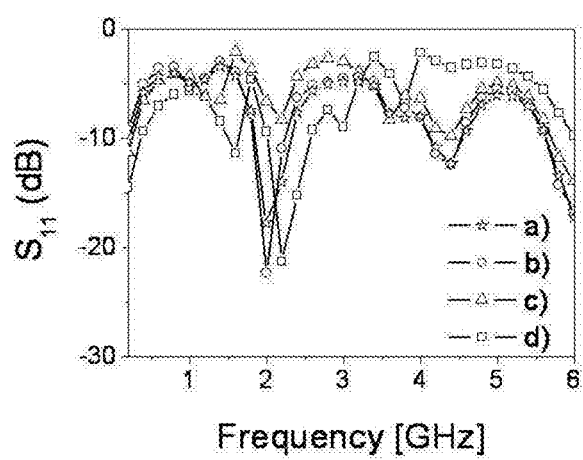
FIG. 72 is a graph showing reflection coefficient relative to the content of magnetic particles in a Cu grid composite.
Figure 73:
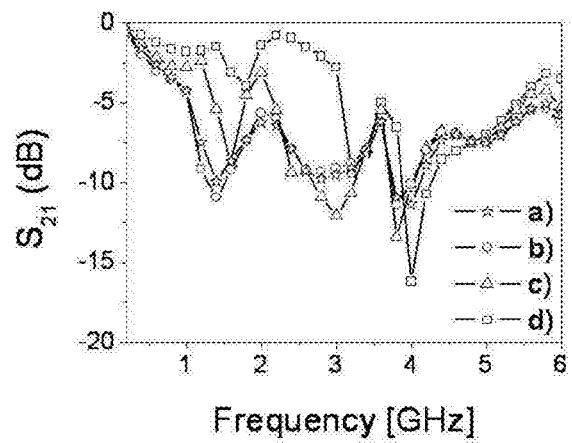
FIG. 73 is a graph showing transmission coefficient relative to the content of magnetic particles in a Cu grid composite.
Figure 74:
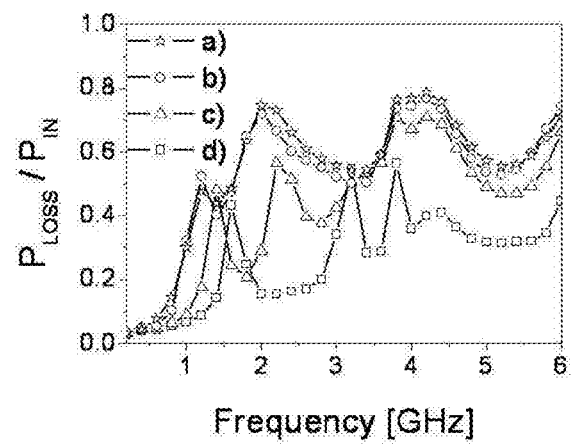
FIG. 74 is a graph showing absorbing power relative to the content of magnetic particles in a Cu grid composite.
Figure 75:
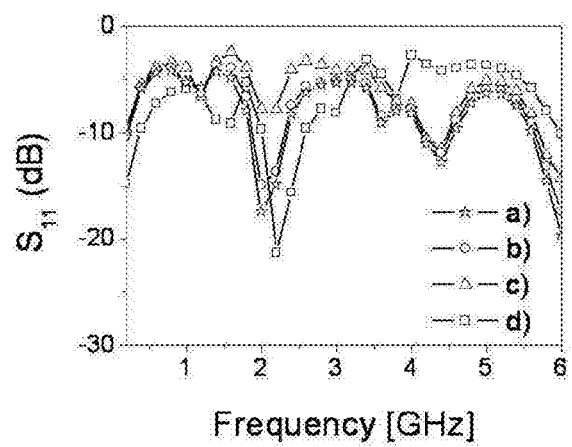
FIG. 75 is a graph showing reflection coefficient relative to the content of magnetic particles in a Ni grid composite.
Figure 76:
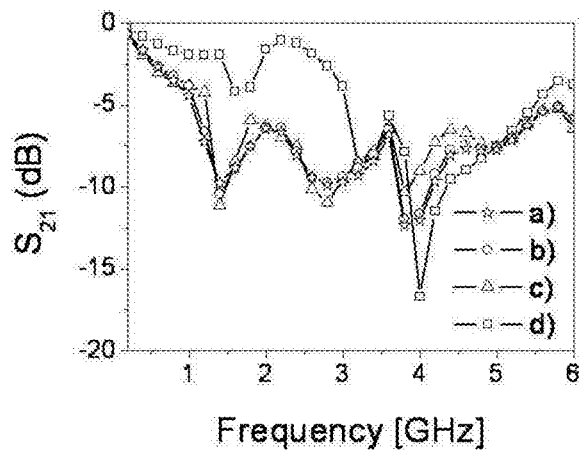
FIG. 76 is a graph showing transmission coefficient relative to the content of magnetic particles in a Ni grid composite.
Figure 77:
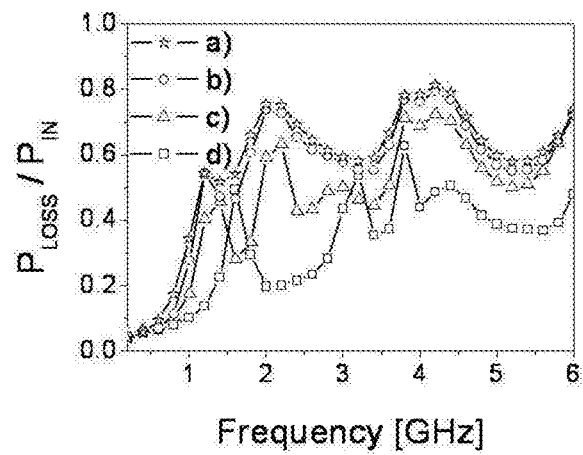
FIG. 77 is a graph showing absorbing power relative to the content of magnetic particles in a Ni grid composite.

A variation in absorbing power obtained when the grid was applied to the above-described magnetic particle composite was analyzed. A magnetic composite whose permeability is adjusted using particles having controllable particle shape and size and in which the particles are contained in a resin, is a powerful absorbing material. When a grid is applied to the magnetic composite, it is expected that good results will be produced. Permeability of the magnetic composite was selected as in FIGS. 18 through 20, and variations in absorbing power when a Cu grid and a Ni grid were applied to the magnetic composite are respectively shown in FIGS. 72 through 74 and FIGS. 75 through 77. In FIGS. 72 through 74, (a) shows a case where the content of magnetic particles is about 40 volume %, (b) shows a case where the content of magnetic particles is about 30 volume %, (c) shows a case where the content of magnetic particles is about 20 volume %, and (d) shows a case where the content of magnetic particles is about 10 volume %. In FIGS. 75 through 77, (a) shows a case where the content of magnetic particles is about 40 volume %, (b) shows a case where the content of magnetic particles is about 30 volume %, (c) shows a case where the content of magnetic particles is about 20 volume %, and (d) shows a case where the content of magnetic particles is about 10 volume %.

INDUSTRIAL APPLICABILITY

A wideband EMW absorber may be located on, under, or on and under a signal line of a device configured to emit EMWs and efficiently absorb EMWs. In particular, since the wideband EMW absorber can be used to shield wideband EMWs within a range of several GHz from a resonant frequency of a magnetic composite, the wideband EMW absorber is industrially applicable.

The invention claimed is:
1. A system comprising:
a wideband electromagnetic wave (EMW) absorber and a signal line of a device configured to emit EMWs,
the wideband electromagnetic wave (EMW) absorber, which is located on, under, or both on and under the signal line of the device configured to emit EMWs, the EMW absorber comprising a magnetic composite in which magnetic particles are dispersed in a polymer resin; and a plurality of conductive lines arranged in the magnetic composite,
wherein the conductive lines comprise a first plurality of conductive lines periodically arranged at predeter- mined intervals in a first direction, and a second plurality of conductive lines periodically arranged at at least one predetermined interval in a second direction, the first plurality of conductive lines arranged in the first direction and the second plurality of conductive lines arranged in the second direction forming a lattice grid, the first plurality of conductive lines arranged in the first direction are arranged parallel to the signal line of the device configured to emit EMWs, the predetermined interval at which the first plurality of conductive lines are arranged in the first direction is equal to the linewidth of the signal line, the magnetic particles are present at a concentration of about 3 to 80 parts by weight based on 100 parts by weight polymer resin, the magnetic particles comprise particles of at least one kind of carbon-based conductor selected from the group consisting of carbon nanotubes (CNTs), carbon nanofibers (CNFs), carbon black, carbon fiber, and graphene, which are coated with a magnetic body, a resonant frequency of the magnetic composite is determined by controlling the size and shape of the magnetic particles, the magnetic particles comprise a plurality of magnetic particles having different resonant frequencies, and EMWs are absorbed in a frequency band equal to or higher than the resonant frequency of the magnetic composite.

2. The system of claim 1, wherein the predetermined interval between the first plurality of conductive lines arranged in the first direction is equal to the interval between the second plurality of conductive lines arranged in the second direction.

3. The system of claim 1, wherein the first and second pluralities of conductive lines are arranged in a central portion between upper and lower portions of the magnetic composite.

4. The system of claim 1, wherein the first and second pluralities of conductive lines are formed of a magnetic conductor selected from the group consisting of an iron (Fe)-based metal, a cobalt (Co)-based metal, a nickel (Ni)-based metal, a molybdenum (Mo)-based metal, a manganese (Mn)-based metal, a neodymium (Nd)-based metal and an alloy thereof.

5. The system of claim 1, wherein the first and second pluralities of conductive lines are formed of a non-magnetic conductor selected from the group consisting of a gold (Au)-based metal, a silver (Ag)-based metal, a copper (Cu)-based metal, an aluminum (Al)-based metal, a platinum (Pt)-based metal, a palladium (Pd)-based metal and an alloy thereof.

6. The system of claim 1, wherein the conductive lines are formed of at least one kind of carbon-based conductor selected from the group consisting of carbon nanotubes (CNTs), carbon nanofibers (CNFs), carbon black, carbon fibers, and graphene.

7. The system of claim 1, wherein the magnetic particles are provided in a variety of shapes.

8. The system of claim 1, wherein at least one kind of carbon-based conductor selected from the group consisting of carbon nanotubes (CNTs), carbon nanofibers (CNFs), carbon black, carbon fibers and graphene is dispersed in the polymer resin in a concentration ranging from 0.01 to 70%, based on the total weight of the magnetic composite.

9. The system of claim 1, wherein the polymer resin comprises a thermoplastic or thermosetting resin.

10. The system of claim 1, wherein the magnetic particles comprise at least one ferrite-based oxide.

11. The system of claim 10, wherein the ferrite-based oxide comprises at least one of a spinel ferrite and a hexagonal ferrite.

12. The system of claim 11, wherein the spinel ferrite comprises at least one of a spinel-structured ferrite containing a nickel-zinc (Ni—Zn) ferrite, a manganese-zinc (Mn—Zn) ferrite and a copper-zinc (Cu—Zn) ferrite, and the hexagonal ferrite comprises a hexagonal-structured ferrite comprising at least one of a barium (Ba) ferrite and a strontium (Sr) ferrite.

\* \* \* \* \*